(12) United States Patent
Coimbra et al.

(10) Patent No.: US 11,689,157 B2
(45) Date of Patent: Jun. 27, 2023

(54) LOW POWER RELAXATION OSCILLATOR CIRCUIT

(71) Applicant: NXP B.V., Eindhoven (NL)

(72) Inventors: Ricardo Pureza Coimbra, Campinas (BR); Luis Enrique Del Castillo, Sao Paulo (BR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/468,191

(22) Filed: Sep. 7, 2021

(65) Prior Publication Data

US 2023/0071036 A1    Mar. 9, 2023

(51) Int. Cl.
  *H03B 5/20* (2006.01)
  *H03K 3/037* (2006.01)
  *H03K 5/24* (2006.01)

(52) U.S. Cl.
  CPC .............. *H03B 5/20* (2013.01); *H03K 3/037* (2013.01); *H03K 5/24* (2013.01)

(58) Field of Classification Search
  CPC ............. H03B 5/20; H03K 3/037; H03K 5/24

USPC ......................................................... 331/143
See application file for complete search history.

(56) References Cited

U.S. PATENT DOCUMENTS

| | | | |
|---|---|---|---|
| 7,375,599 B2 * | 5/2008 | Molina ............... | H03K 3/0231 327/120 |
| 7,525,394 B2 | 4/2009 | Gerber et al. | |
| 7,733,191 B2 | 6/2010 | Olmos et al. | |
| 8,085,102 B2 | 12/2011 | Muller | |
| 9,048,821 B2 | 6/2015 | Sinitsky et al. | |
| 9,385,649 B2 * | 7/2016 | Wang ................... | H03K 3/0231 |
| 10,601,408 B2 | 3/2020 | Chauhan et al. | |
| 10,782,727 B2 | 9/2020 | Pereira et al. | |
| 2012/0194279 A1 * | 8/2012 | Nonis ..................... | H03K 4/501 331/34 |
| 2022/0239284 A1 * | 7/2022 | Yu ......................... | H03K 3/0231 |

* cited by examiner

*Primary Examiner* — Richard Tan

(57) ABSTRACT

A low power relaxation oscillator circuit includes, in one embodiment, a first comparator for comparing voltages at first and second inputs, respectively, a first capacitor coupled to the first input of the first comparator, and a first circuit configured for charging the first capacitor to a first voltage. The first voltage is related to a propagation delay of the first comparator.

16 Claims, 23 Drawing Sheets

LOW POWER RELAXATION OSCILLATOR CIRCUIT

BACKGROUND

A relaxation oscillator is a circuit that produces a repetitive output signal (or oscillating signal), such as a square wave, for use with many devices such as switching power supplies, dual-slope analog-to-digital converters, function generators, etc. The oscillating signal is produced using a capacitor that is discharged, charged until it reaches a threshold voltage, and then discharged again. The process is repeated with a period of the oscillation that depends on the time constant of the capacitor.

BRIEF DESCRIPTION OF THE DRAWINGS

The use of the same reference symbols in different drawings indicates similar or identical items.

DETAILED DESCRIPTION

Relaxation oscillator circuits can be adversely affected by variables such as temperature drift and current leakage. Disclosed is a low-power relaxation oscillator circuit (oscillator circuit) that is configured, for periodic self-calibration.

Figure 1:
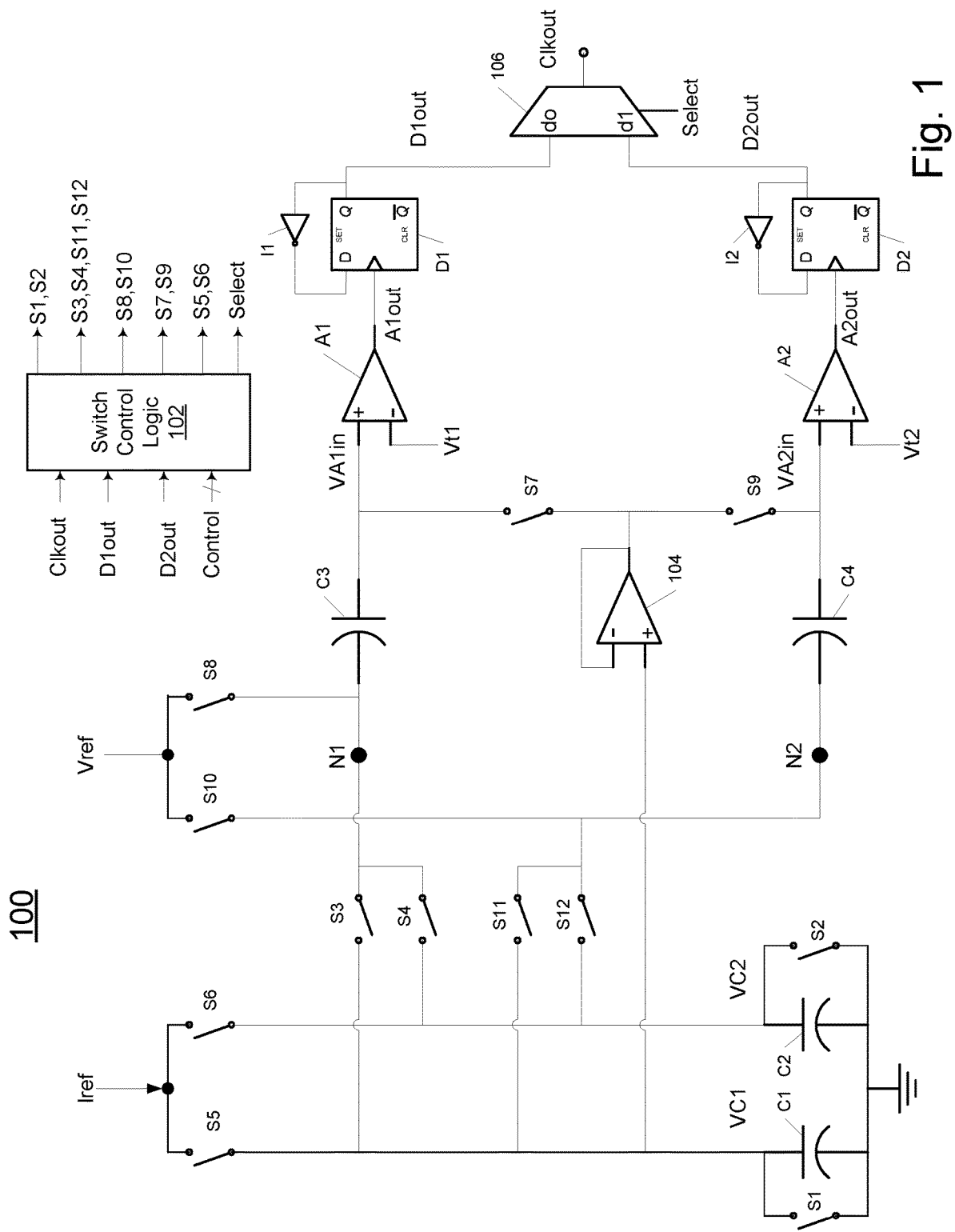
FIG. 1 is a schematic diagram illustrating a relaxation oscillator according to one embodiment of the present disclosure.

FIG. 1 is a schematic diagram illustrating oscillator circuit 100 according to one embodiment of the present disclosure. Oscillator 100 includes: capacitors C1-C4; switches S1-S12; a switch control logic circuit 102; unity gain buffer 104; comparators A1 and A2; D flip-flops D1 and D2; inverters I1 and I2, and; multiplexer 106. A unity gain buffer acts as a true buffer, providing no amplification or attenuation to the signal; it provides a gain of 1. Capacitors C1 or C2 are cyclically charged and discharged during operation of oscillator 100 as will be more fully described below.

Switch control logic 102, which may take form in a digital state machine, controls switches S1-S12 and multiplexer 106. Each switch S1-S12 is controlled by a respective digital control signal having the same designation (e.g., switch S1 is controlled by signal S1). Multiplexer 106 is controlled by a digital Select signal; when Select is asserted, multiplexer 106 connects its output to the output of flip-flop D1, and when Select is not asserted, multiplexer 106 connects its output the output of flip-flop D2. Switch control logic 102 generates each of the digital control signals S1-S12 and Select signal based upon one or more inputs as shown including: Clkout, the output signal of multiplexer 106; D1$out$, the output of D flip-flop D1; D2$out$, the output of D flip-flop D2, and; a multibit control signal Control that includes an enable signal (i.e., Enable, not shown in FIG. 1).

Comparator A1 controls the clock input of flip-flop D1. Inverter I1 is coupled between the input and output of flip-flop D1 as shown. D1out triggers from low to high or high to low depending on the input when D1 is clocked by comparator A1. Comparator A2 controls the clock input of flip-flop D2. Inverter I2 is coupled between the input and output of flip-flop D2 as shown. The output D2out triggers from low to high or high to low depending on the input when D2 is clocked by comparator A2.

Capacitor C3 is connected between node N1 and a positive input of comparator A1. The negative input of comparator A1 is connected to a threshold voltage Vt1. The output A1out of comparator A1 controls D1 as noted. The output of D1 is provided as one input to multiplexer 106. Capacitor C4 is connected between node N2 and a positive input of comparator A2. The negative input of comparator A2 is connected to a threshold voltage Vt2. The output A2out of comparator A2 controls D2 as noted. The output of D2 is provided as another input to multiplexer 106. The output of multiplexer 106, which is controlled by the Select signal from switch control logic 102, provides output oscillator circuit output signal Clkout.

A voltage source (not shown) provides a constant reference of voltage Vref, which can be selectively connected to capacitors C3 and C4 via switches S8 and S10, respectively, during calibration or recalibration of oscillator 100 as will be more fully described. Capacitors C1 and C2 can be selectively connected to a current source (not shown) that provides a substantially constant reference current Iref via switches S5 and S6, respectively. Iref is proportional to Vref (e.g., Iref=Vref/R, where R is a known resistance value). Capacitors C1 and C2 can be selectively discharged through switches S1 and S2. Switches S3 and S4 selectively couple capacitors C1 and C2 to capacitor C3, and switches S11 and S12 selectively couple capacitors C1 and C2 to capacitor C4 during run mode in which output signal Clkout is generated as will be more fully described below. Capacitors C3 and C4 are charged during calibration to a voltage that represents propagation delays as will be more fully described below.

Vref, unity gain buffer 104 and capacitor C1 are used during a process for calibrating or recalibrating oscillator 100. A positive input of unity gain buffer 104 is connected to capacitor C1. The output of unity gain buffer 104 can be selectively coupled to C3 and C4, respectively, via switches S7 and S9, respectively.

Capacitors C1 and C2 should have substantially equal capacitance C. Oscillator 100 generates output signal Clkout with a target frequency inversely proportional to the product of a resistance R and capacitance C. Constant current Iref charges C1 or C2 to generate a voltage VC1 and VC2, respectively, which ramp up at a rate inversely proportional to the RC product.

A1out, the output of comparator A1, triggers and clocks D1 after voltage VA1in exceeds comparators A1's threshold voltage Vt1. When clocked, flip-flop D1 toggles its output D1out after a propagation delay that can vary with temperature, supply voltage, etc. A2out, the output of comparator A2, triggers and clocks D2 after voltage VA2in exceeds comparators A2's threshold voltage Vt2. When clocked, flip-flop D2 toggles its output D2out after a propagation delay temperature, supply voltage, etc. Clkout, the output of multiplexer 106, toggles with D1out or D2out after a propagation delay temperature, supply voltage, etc.

The frequency of Clkout may be affected by propagation delays of comparator A1, D1, multiplexor 106, and/or switch control logic 102, which can vary over time with changes in temperature, leakage current, supply voltage, etc. Oscillator 100 is periodically calibrated during run mode to correct a change in frequency of Clkout due to changing propagation delays. Calibration includes periodically charging capacitors C3 and C4 with voltages Vshift1 or Vshift2 based on the propagation delays. VC1 and VC2, which are voltages on capacitors C1 and C2 as they are charged during run mode, are adjusted by Vshift1 and Vshift2, respectively, before they are compared to threshold voltages V1t and V2t, respectively, by comparators A1 and A2, respectively.

Figure 2:
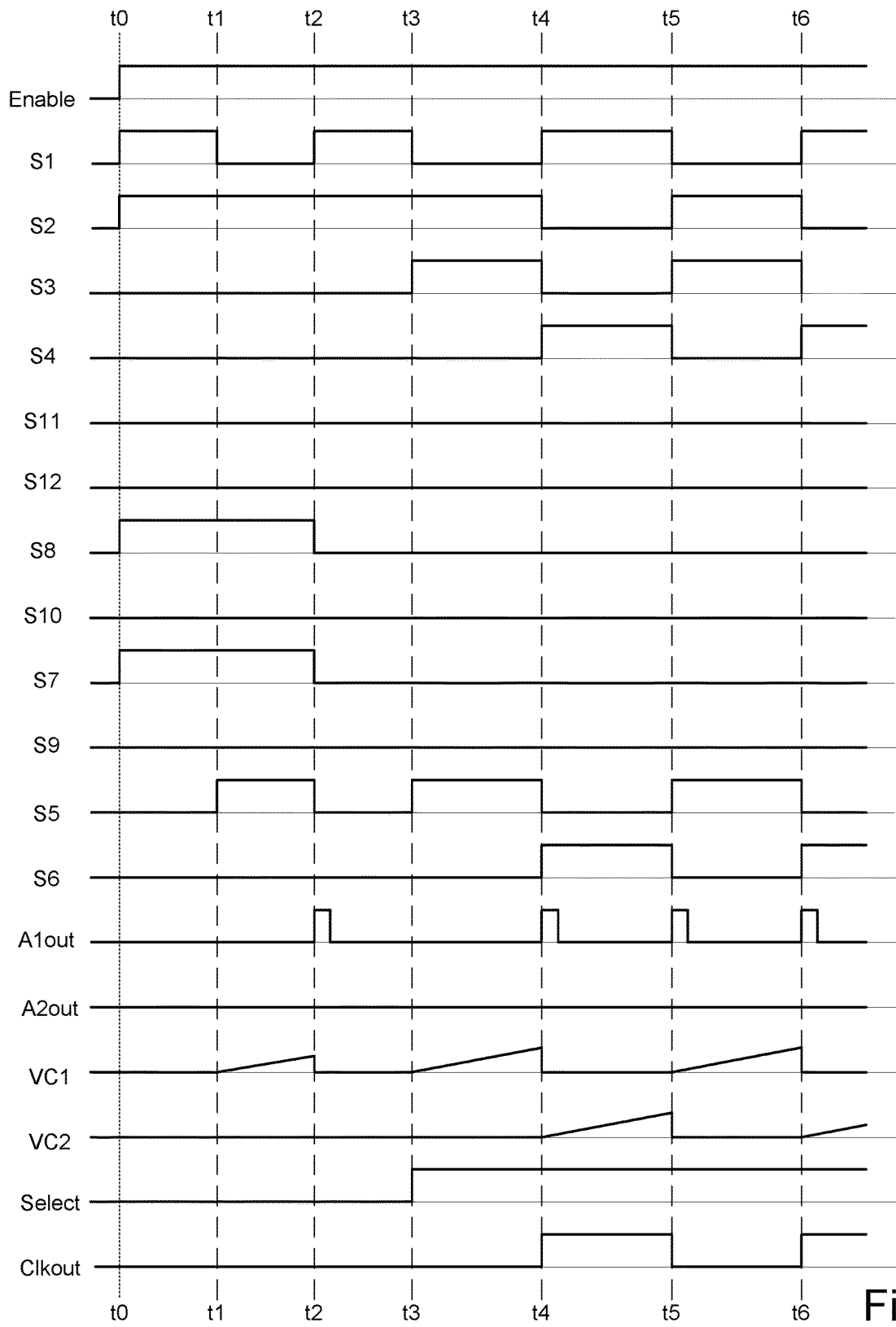
FIG. 2 is a timing diagram that illustrates relevant aspects of an example process for calibrating and running the relaxation oscillator shown in FIG. 1.
Figure 3:
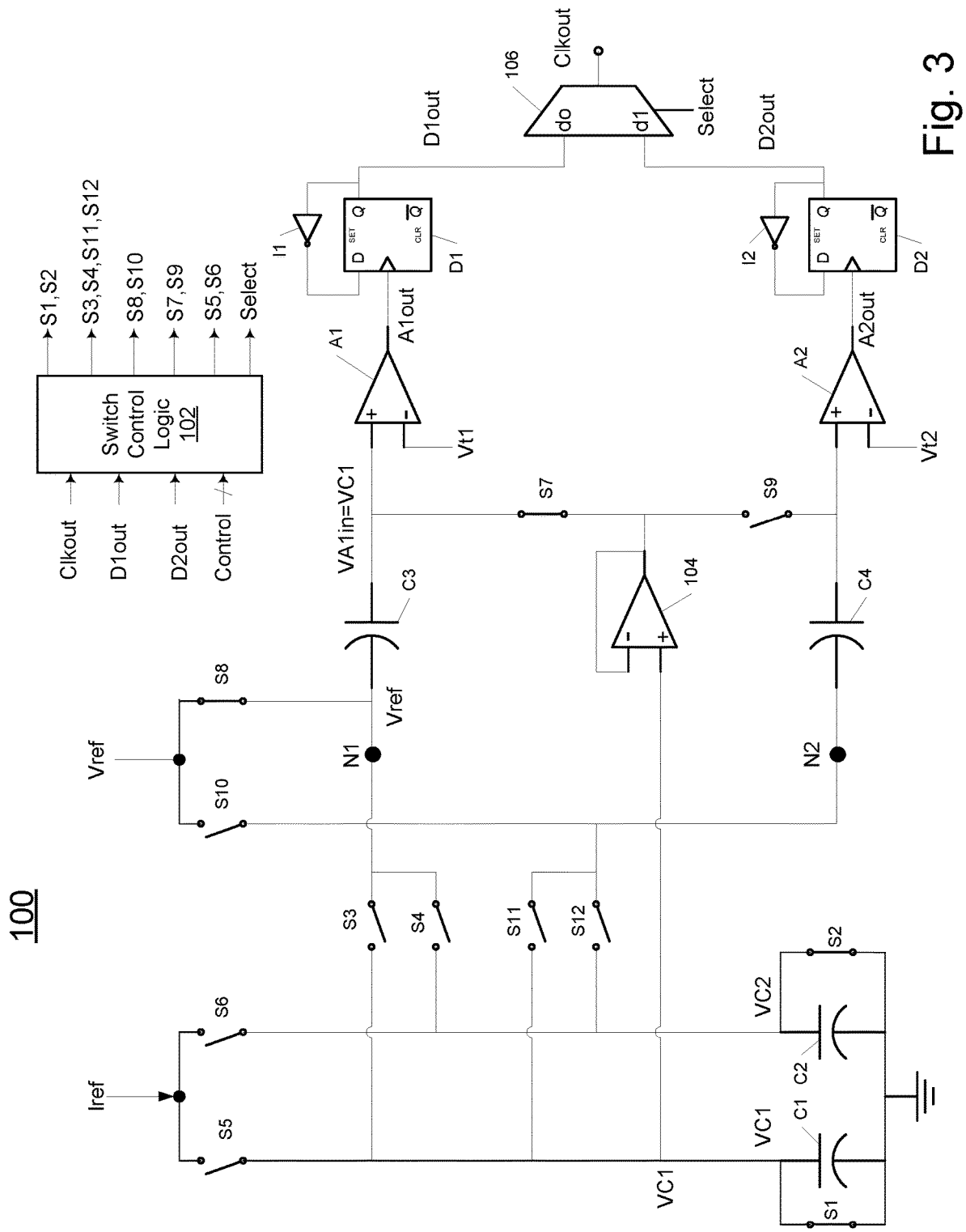
FIG. 3 shows the relaxation oscillator of FIG. 1 in a first state during calibration.
Figure 4:
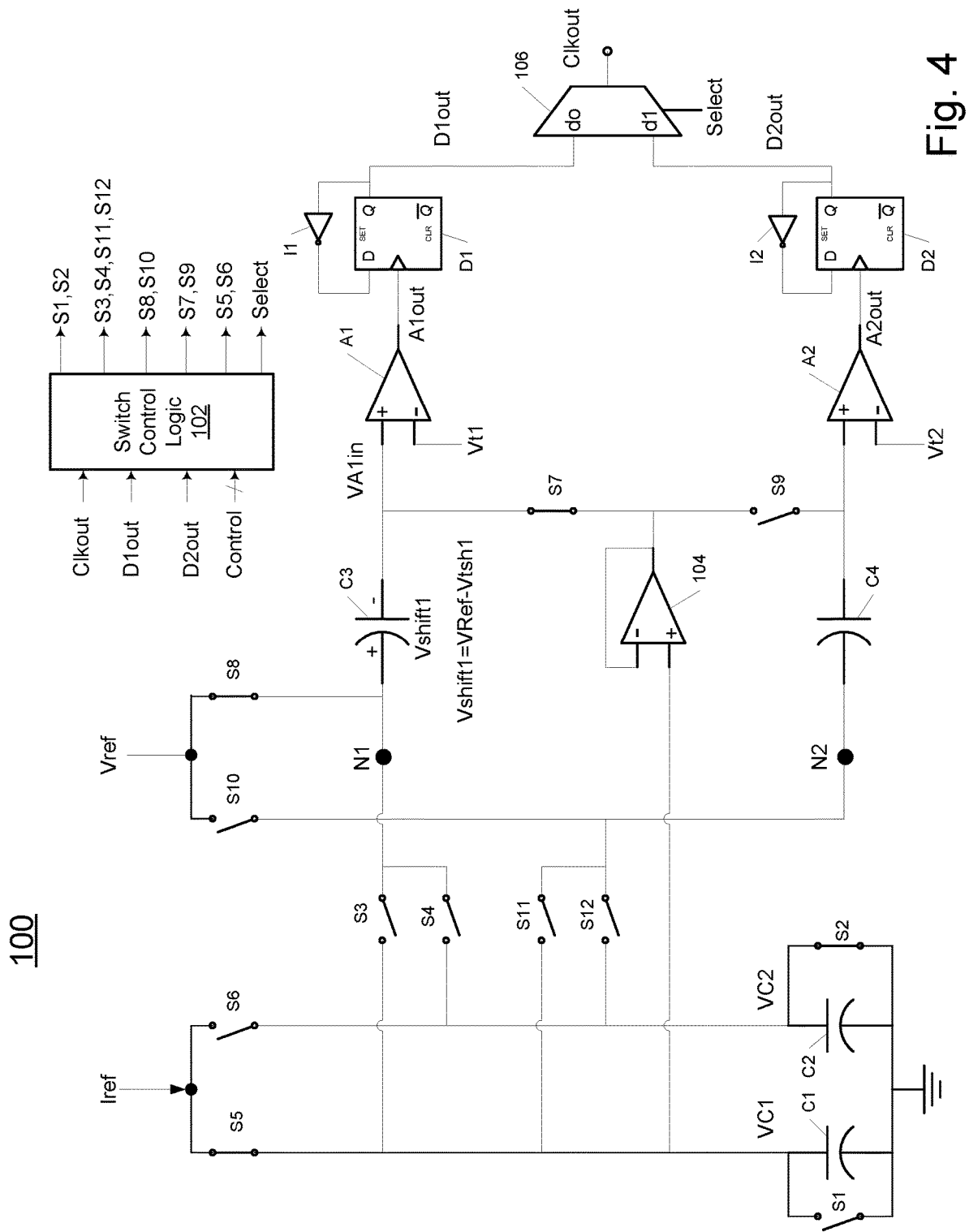
FIG. 4 shows the relaxation oscillator of FIG. 1 in a second state during calibration.
Figure 5:
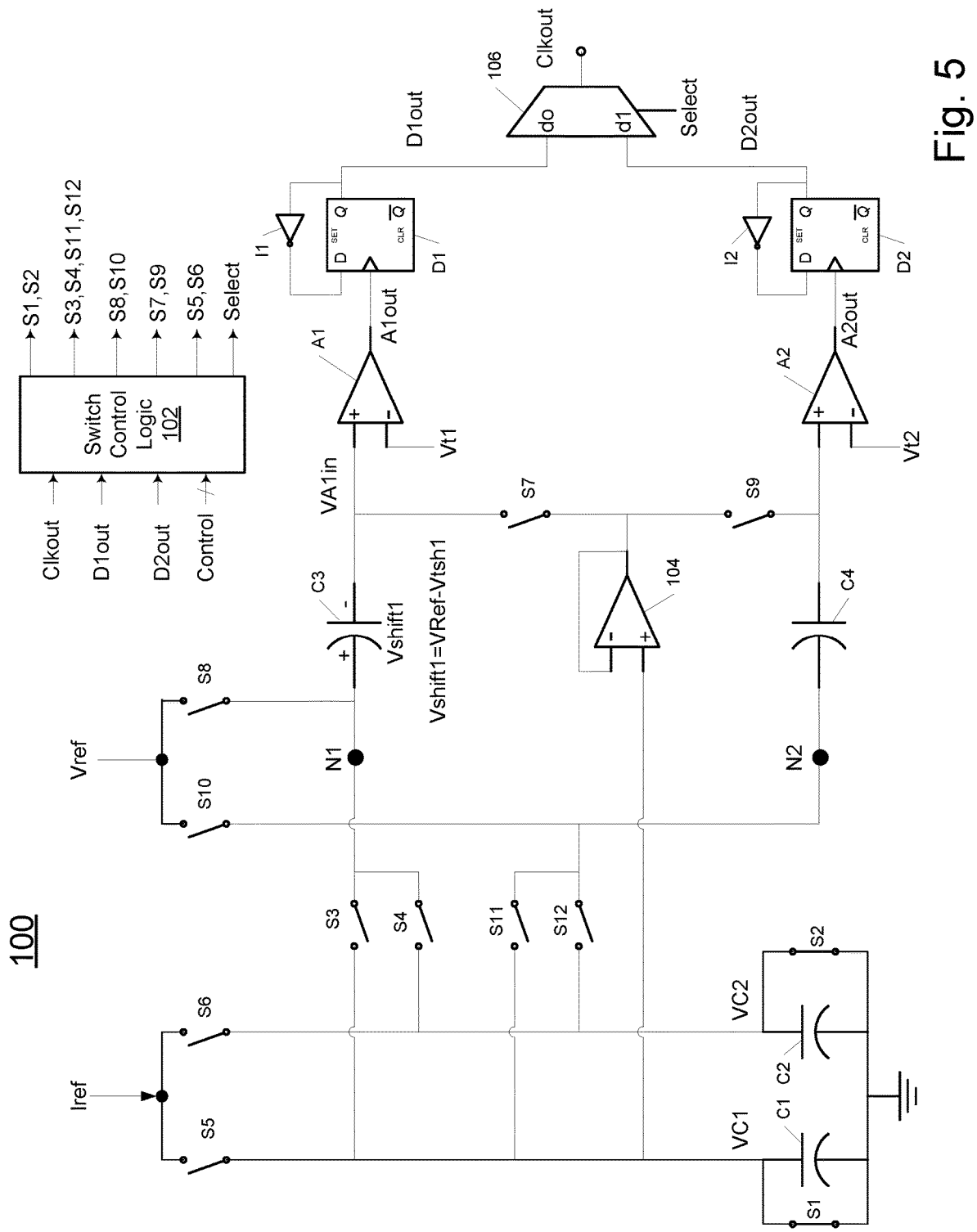
FIG. 5 shows the relaxation oscillator of FIG. 1 in a third state during calibration.

FIG. 2 is a timing diagram that illustrates relevant aspects of an example process for calibrating and running relaxation oscillator 100. The calibration process begins at time t0 when the Enable signal, which is received by switch control logic 102, is asserted. In response switch control logic 102 closes switches S1, S2, S7 and S8 (see FIG. 3). Closed switches S1 and S2 discharge capacitors C1 and C2. Closed switch S8 connects node N1 to Vref. Closed switch S7 connects C3 and the positive input of A1 to VC1, the voltage on C1, via unity gain buffer 104. Initially, VC1=0V after switch S1 is closed. A short time later at time t1, switch control logic 102 opens switch S1 and closes switch S5 (see FIG. 4). VC1 increases across capacitor C1 as it is charged by Tref via closed switch S5. VC1 is applied to the positive input of comparator A1 via unity gain buffer 104. FIG. 2 shows VC1 increasing in magnitude. At some point in time VC1 surpasses A1's threshold voltage, and in response comparator A1 asserts its output A1out, which is coupled to the clock input of D1. D1out toggles to high, which prompts switch control logic 102 to close switch S1 after some delay, which in turn discharges C1, and to open switches S5, S7 and S8 (see FIG. 5) at time t2 (see FIG. 2). Importantly, C3 is charged to Vshift1=Vref−Vtsh1, where Vtsh1=VA1*in* at the point when switches S7 and/or S8 are opened. Vshift1 remains across capacitor C3 after switches S7 and S8 are opened. Vshift1 represents the delay between the time when A1's threshold voltage is exceeded and the time when switches S7 and/or S8 are opened.

At time t3, switch control logic 102 asserts the Select signal, and oscillator 100 is placed into run mode during which periodic signal Clkout is generated. During run mode switches S1 and S2 are alternately opened and closed, switches S3 and S4 are alternately opened and closed, and switches S5 and S6 are alternately opened and closed. More specifically switches S1, S4 and S6 are closed while switches S2, S3, and S5 are opened, and vice-versa as shown in FIG. 2. The output of D1 is connected to the output of multiplexor 106.

Figure 6:
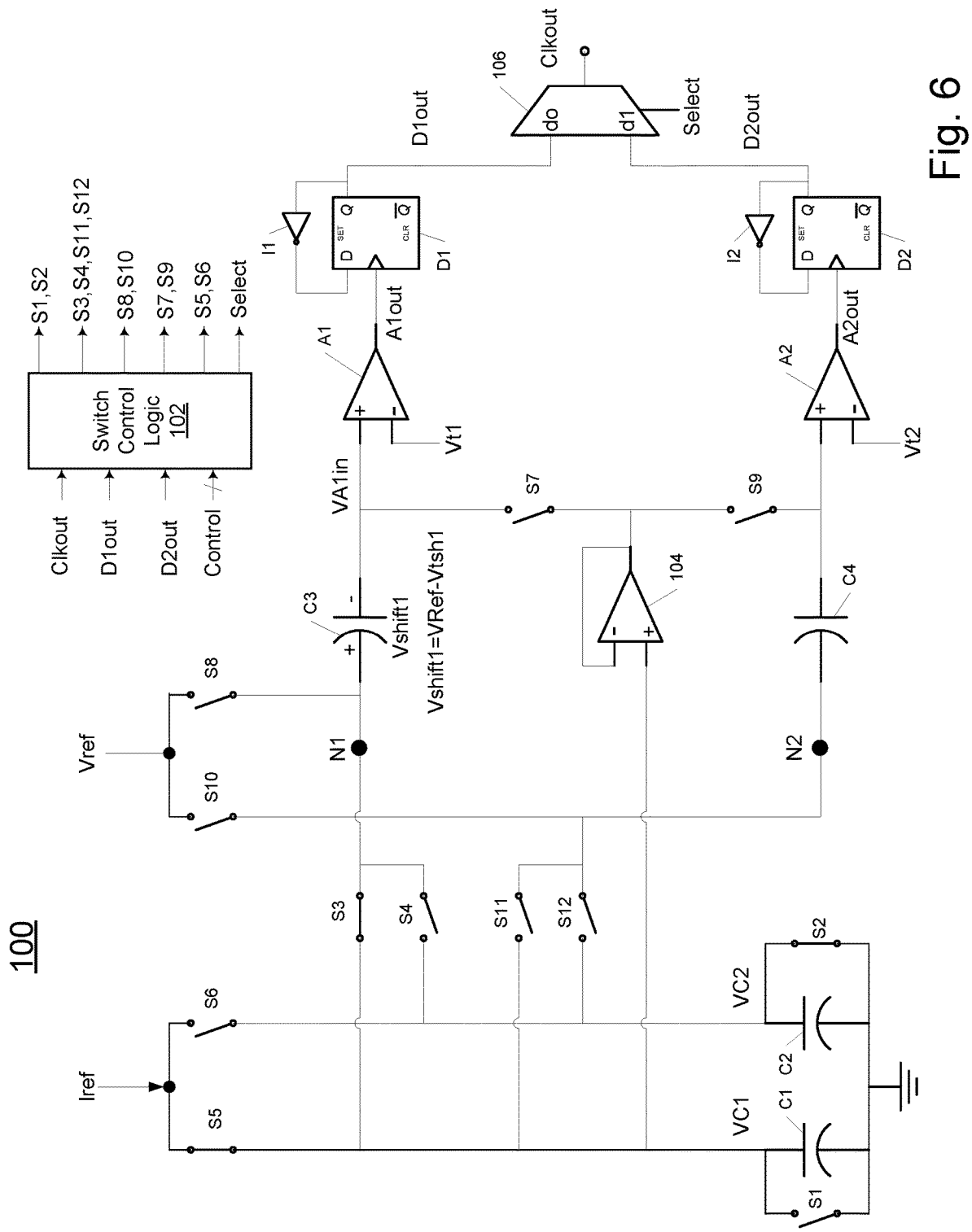
FIG. 6 shows the relaxation oscillator of FIG. 1 in a first state during run mode after calibration.
Figure 7:
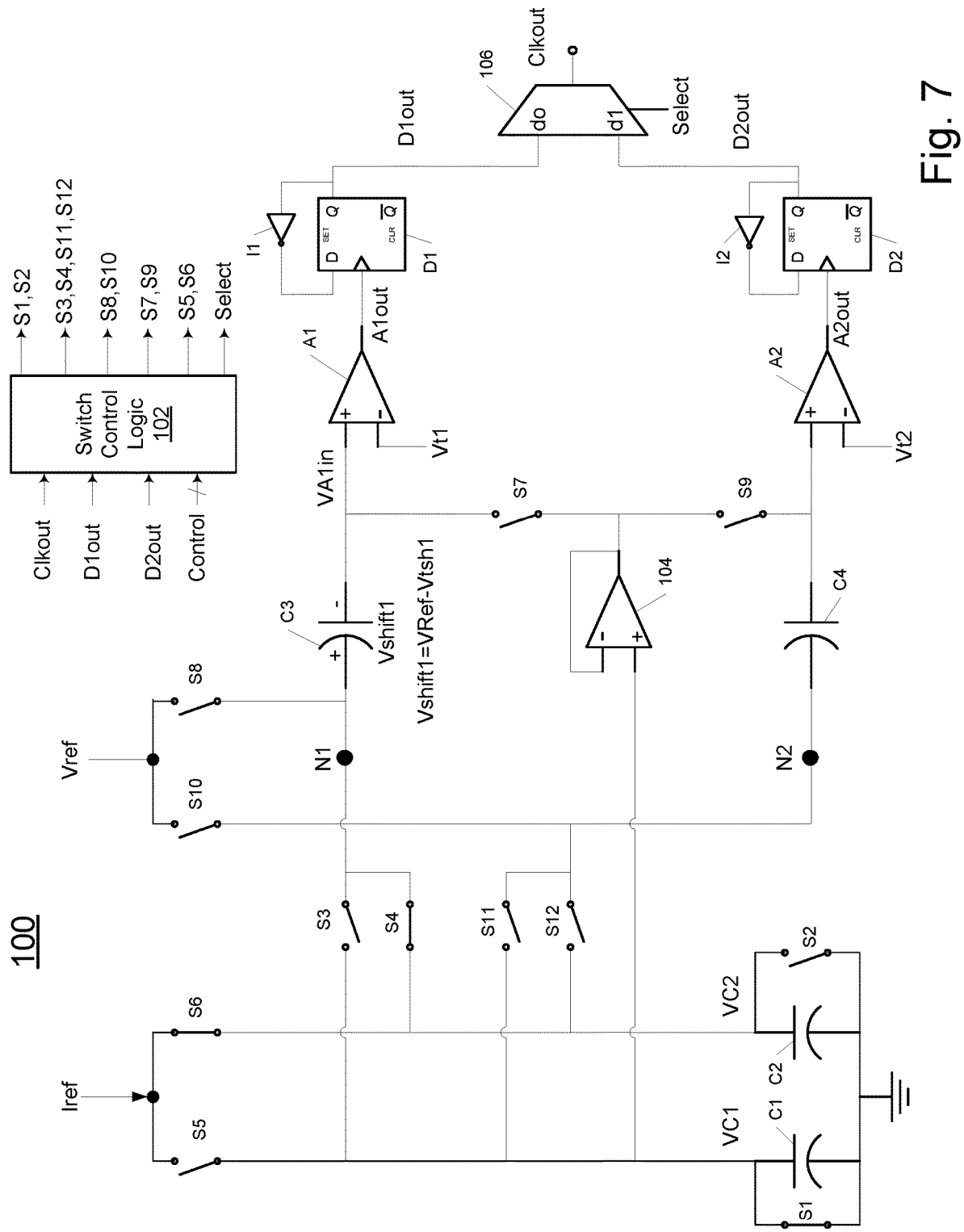
FIG. 7 shows the relaxation oscillator of FIG. 1 in a second state during run mode after calibration.
Figure 8:
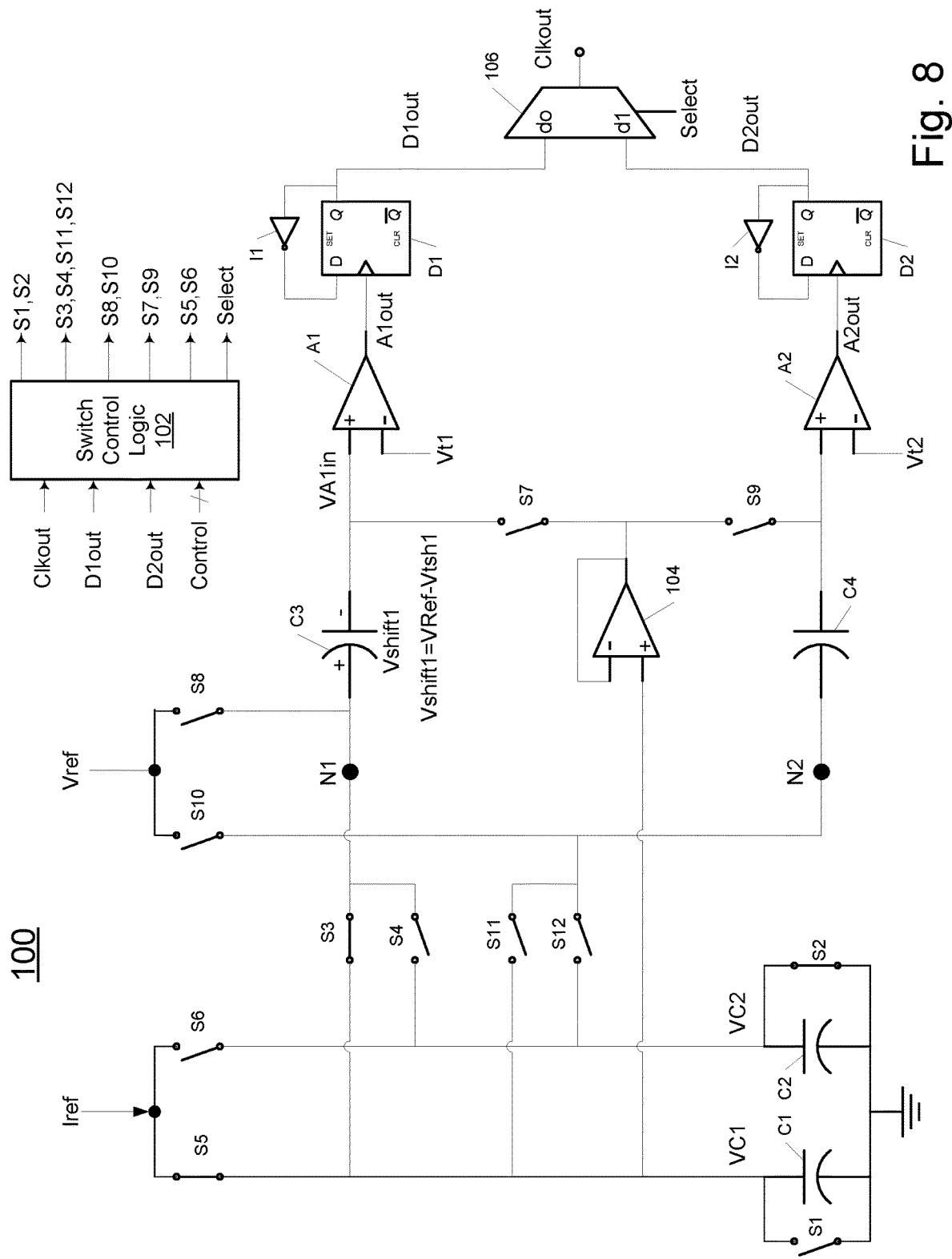
FIG. 8 shows the relaxation oscillator of FIG. 1 in a third state during run mode after calibration.

At time t3 switch control logic 102 closes switches S3 and S5, and opens switches S1 and S6 (see FIG. 6). Again, VA1in=VC1−Vshift1 and represents propagation delay. Initially VC1=0 V. VA1in rises as VC1 increases. FIG. 2 shows VC1 increasing as C1 is charged by Tref. After VA1in exceeds A1's threshold voltage at time t4, the output of comparator A1 is asserted, which in turn toggles D1out1 from low to high. Clkout also toggles from low to high as shown in FIG. 2 since the output of multiplexer 106 is coupled to the output of D flip-flop D1. In response to D1out toggling, switch control logic 102 opens S2, S3 and S5, and closes S1, S4, and S6 (see FIG. 7). C1 is discharged when S1 is closed. VC2 is at ground when S4 is first closed, and as a result VA1in drops below A1's threshold, which in turn quickly drives VA1out to ground. VC2 begins to increase as C2 is charged by Tref as shown in FIG. 2. VA1in increases with VC2. When VA1in exceeds A1's threshold at time t5, the output of comparator A1 is asserted, which in turn toggles D1out1 from high to low. Clkout also toggles from high to low as shown in FIG. 2. In response to D1out toggling, switch control logic 102 closes S2, S3 and S5, and opens S1, S4, and S6 (see FIG. 8). VA1in drops below Vt1 with the closing of switch S3, which in turn quickly drives VA1out to ground. VC1 begins to rise as C1 is charged by Tref as shown in FIG. 2. As VC1 increases so does VA1in. When VAin exceeds A1's threshold at time t6, the output of comparator A1 is asserted, which in turn toggles D1out1 from low to high. Clkout also toggles from low to high as shown in FIG. 2. The process continues and Clkout oscillates accordingly.

Figure 9:
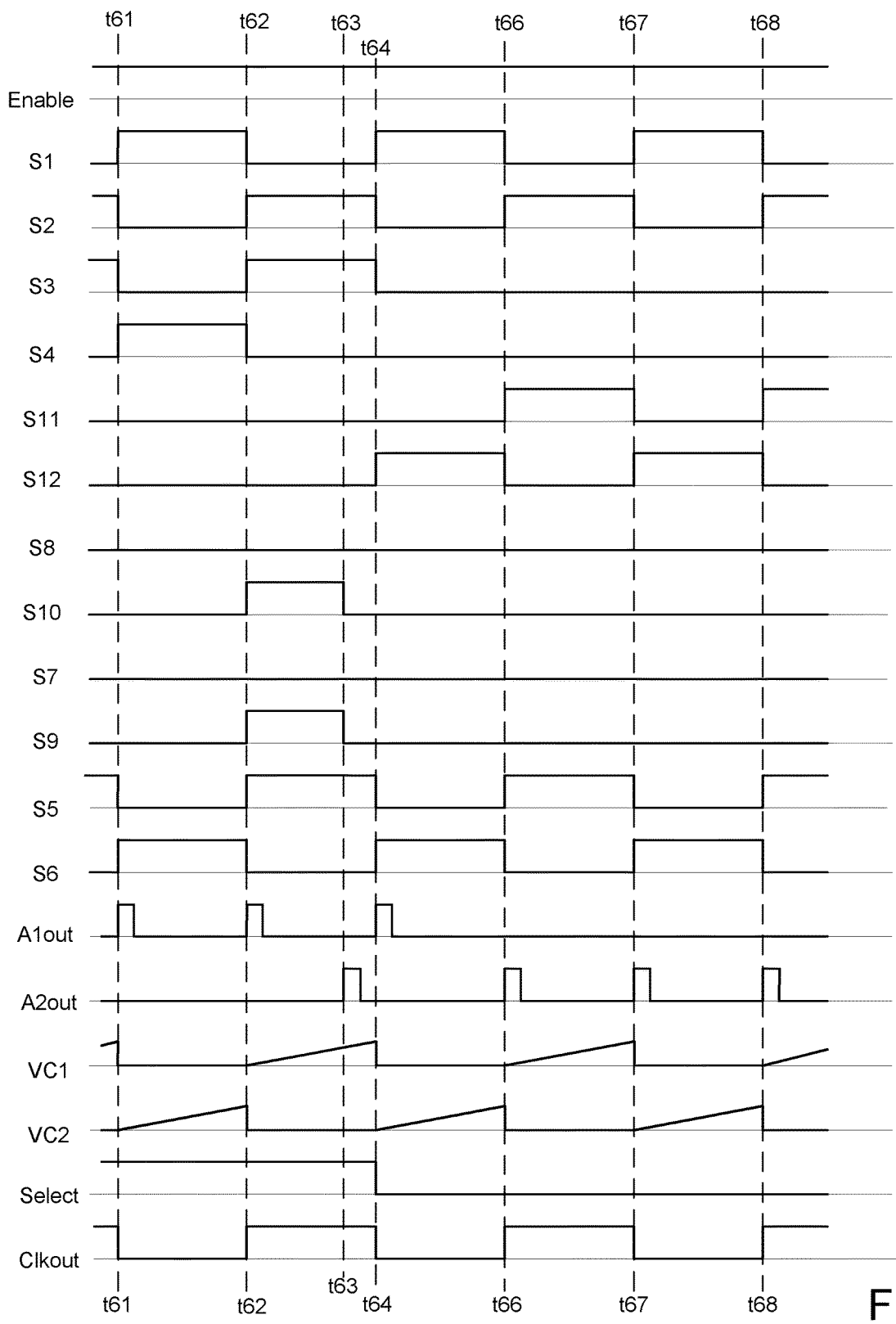
FIG. 9 is a timing diagram that illustrates relevant aspects of an example process for recalibrating and running the relaxation oscillator shown in FIG. 1.
Figure 10:
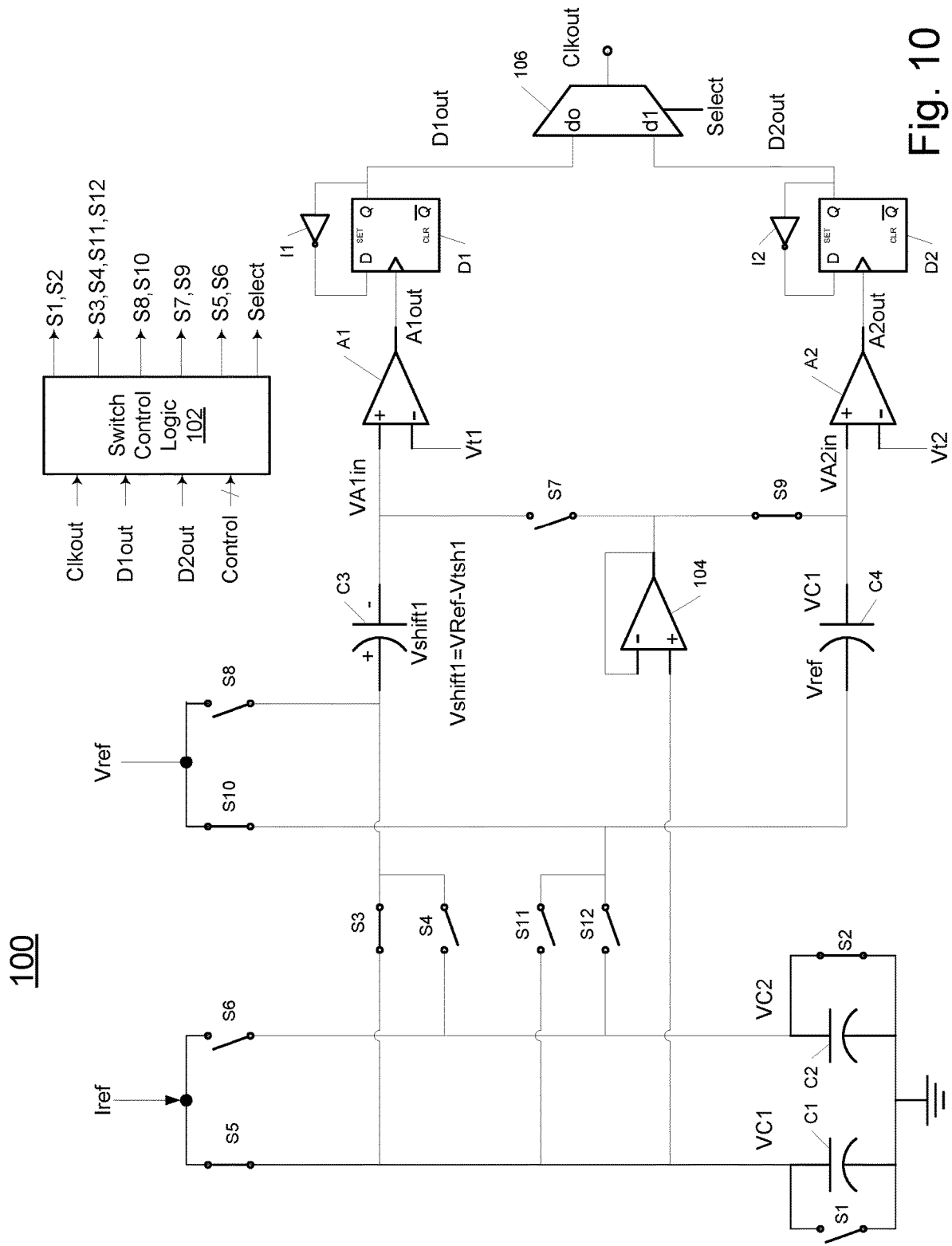
FIG. 10 shows the relaxation oscillator of FIG. 1 in a first state during recalibration.

The performance of oscillator 100 may be adversely affected by changes in temperature, leakage current, etc. Oscillator 100 can be periodically recalibrated to accommodate changes in one or more of these variables. Recalibration can be performed while Clkout continues to be generated. Switch control logic 102 may track the number of Clkout transitions from low to high. After X transitions (e.g., X=30), switch control logic 102 may start the recalibration process. FIG. 9 is a timing diagram that illustrates relevant aspects of an example process for recalibrating relaxation oscillator 100. The recalibration process begins when switch control logic 102 closes switches S9 and S10 at time t62 in FIG. 9. FIG. 10 shows oscillator 110 with closed switches S2, S3, S5, S9, and S10. It is noted that switches S9 and S10 in FIG. 10 are closed while oscillator 100 continues to operate in run mode. While these switches are closed VC1, which increases in magnitude as shown in FIG. 9, is applied to the positive input of comparator A2 via unity gain buffer 104. At some point in time VC1 exceeds comparator A2's threshold. Shortly after that point comparator A2 asserts its output A2out, which is coupled to the clock input of D2. D2out toggles to high, which prompts switch control logic 102 to open switches S9 and S10 (see FIG. 11) at time t63

Figure 11:
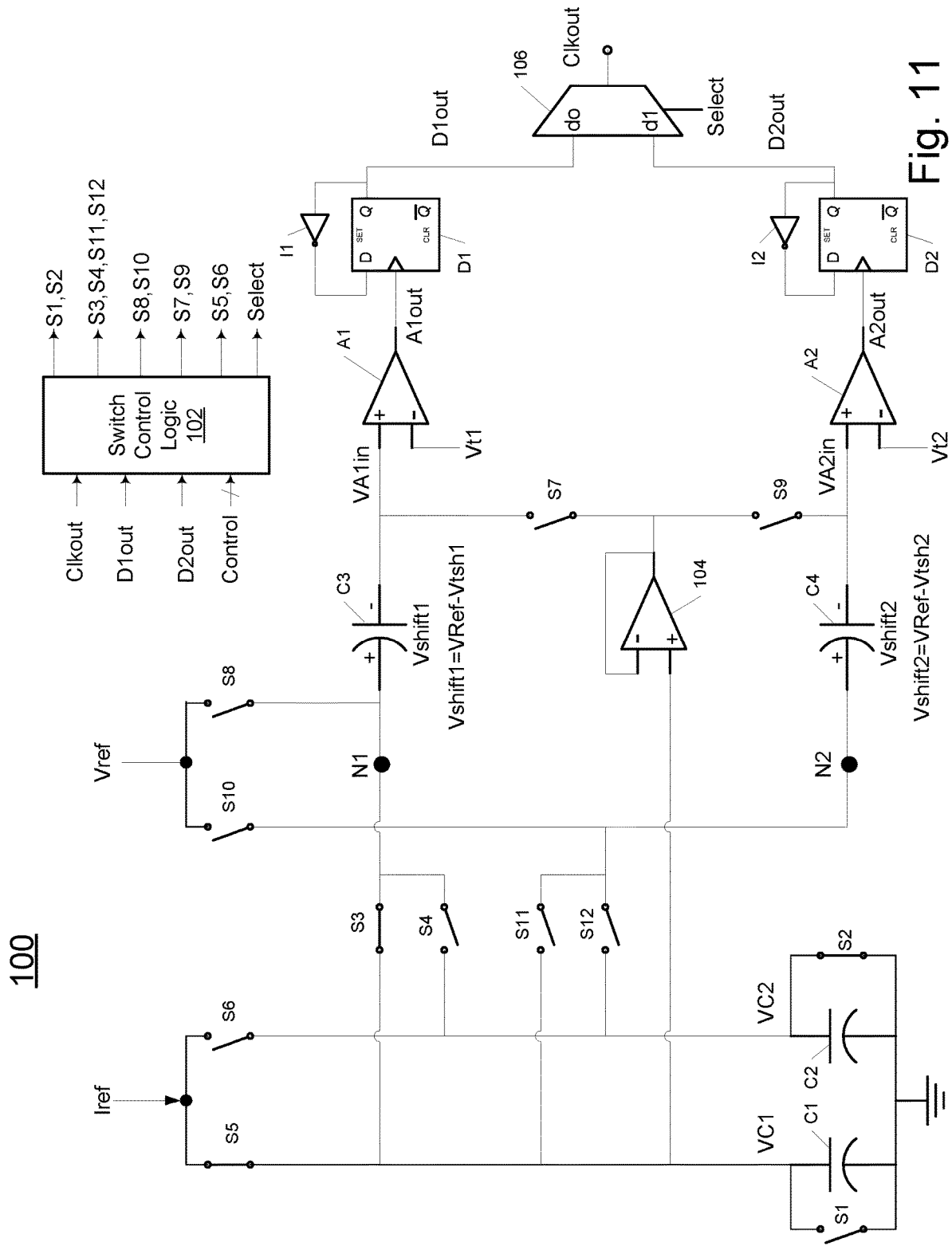
FIG. 11 shows the relaxation oscillator of FIG. 1 in a second state during recalibration.

(see FIG. 9). FIG. 11 illustrates oscillator 110 after switches S9 and S10 are opened. C4 is charged to Vshift2=Vref−Vtsh2, where Vtsh2=VA2in at the point in time when switches S9 and/or S10 are opened. Vshift2 remains across capacitor C4 after switches S9 and S10 are opened. Vshift2 represents propagation delay.

Figure 12:
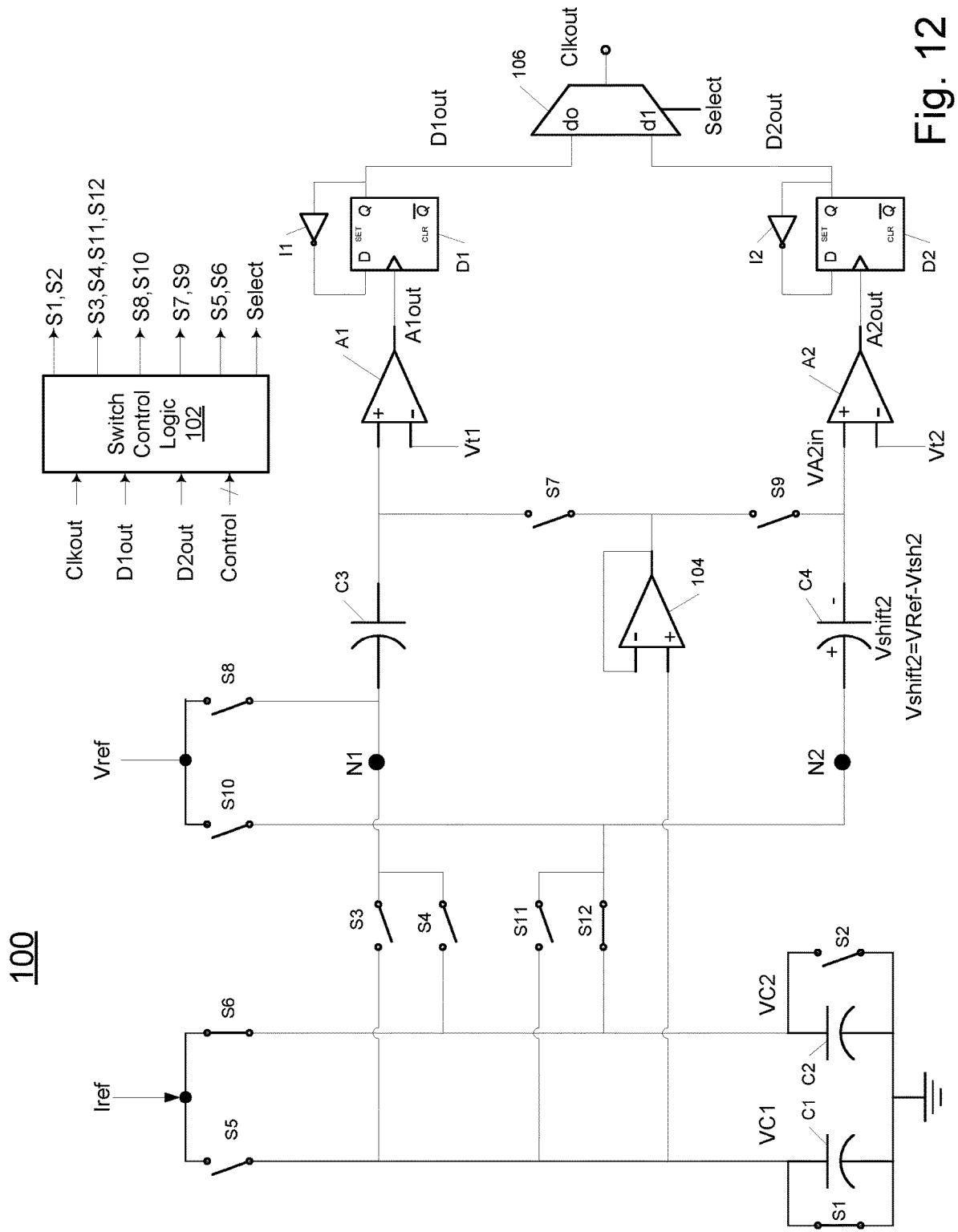
FIG. 12 shows the relaxation oscillator of FIG. 1 in a first state during run mode after recalibration.

Switches S2, S3 and S5 remain closed as C1 is charged by Tref, and VC1 continues to increase. When VA1in exceeds A1's threshold at time t64 (see FIG. 9), the output of comparator A1 is asserted, which in turn toggles D1out1 from low to high. Clkout also toggles from high to low as shown in FIG. 9. Switch control logic 102 deactivates the Select signal in response to D1out or Clkout toggling to low, thereby connecting D2out to the output of multiplexer 106. Also shortly after time t64 switch control logic 102 closes S1, S6, and S12, and opens S2, S5 and S11. FIG. 12 shows oscillator 110 with S1, S6, and S12 closed and S2, S5 and S11 open. C1 is discharged through S1. Initially voltage VC2=0V, and as a result VA2in drops below A2's threshold with the closing of switch S12, which in turn drives VA2out to ground. VC2 begins to rise as shown in FIG. 9 as C2 is charged by Tref. As VC2 increases so does VA2in. When VA2in exceeds Vt2, the output of comparator A2 is asserted, which in turn toggles D2out1 from low to high. At time t66 Clkout also toggles from low to high as shown in FIG. 9.

Figure 13:
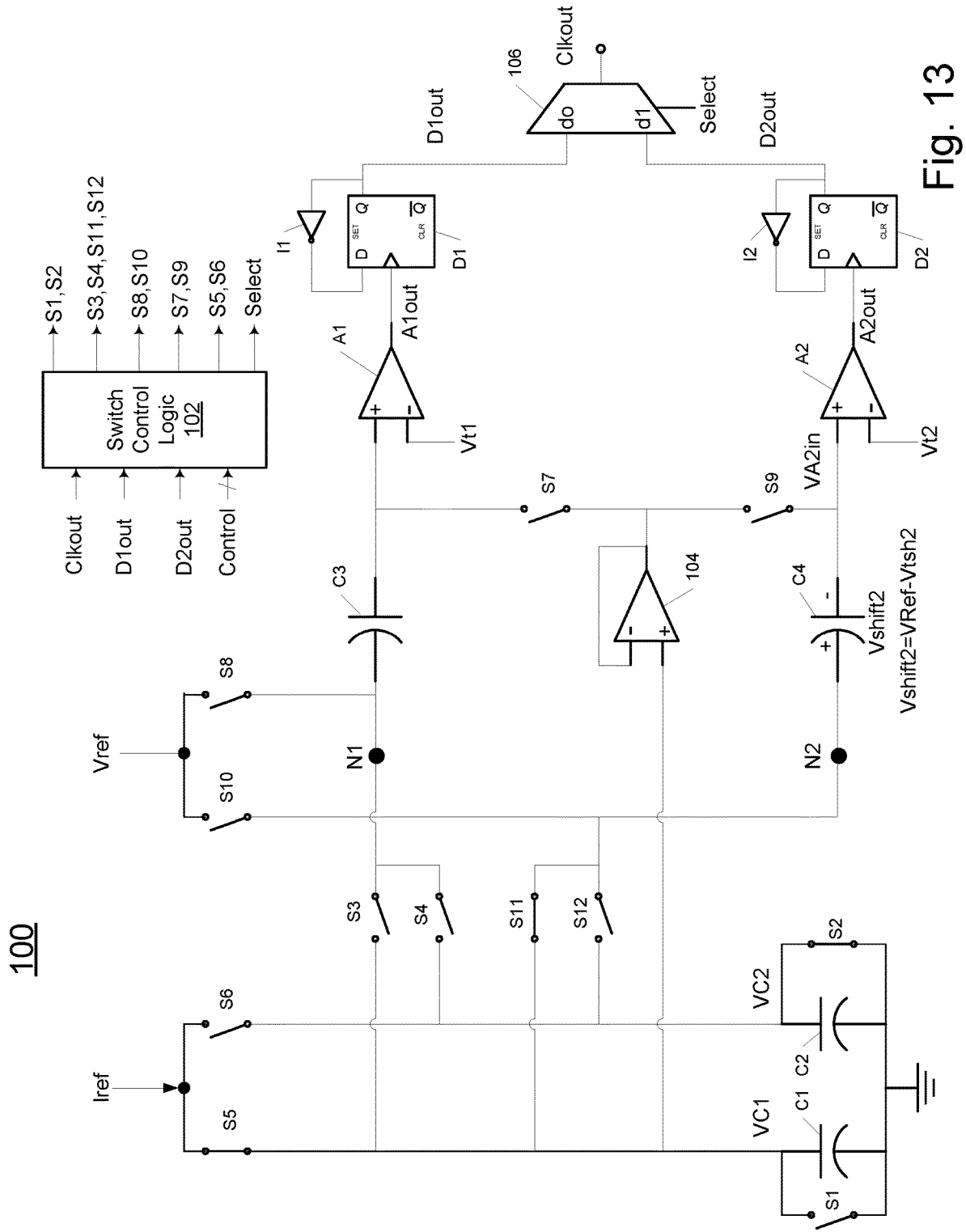
FIG. 13 shows the relaxation oscillator of FIG. 1 in a second state during run mode after recalibration.

At time t67 switch control logic 102 closes S2, S5 and S11, and opens S1, S6, and S12. FIG. 13 shows oscillator 110 with S1, S6, and S12 opened and S2, S5 and S11 closed. C1 is immediately discharged at t67 through S1. Initially voltage VC2=0 V, and as a result VA2in drops below A2's threshold, which in turn drives VA2out to ground. VC2 begins to rise as shown in FIG. 9 as C2 is charged by Tref. As VC2 increases so does VA2in. When VA2in exceeds A2's threshold at time t68, the output of comparator A2 is asserted, which in turn toggles D2out1 from low to high. Clkout also toggles from low to high as shown in FIG. 9. The process repeats.

Figure 14:
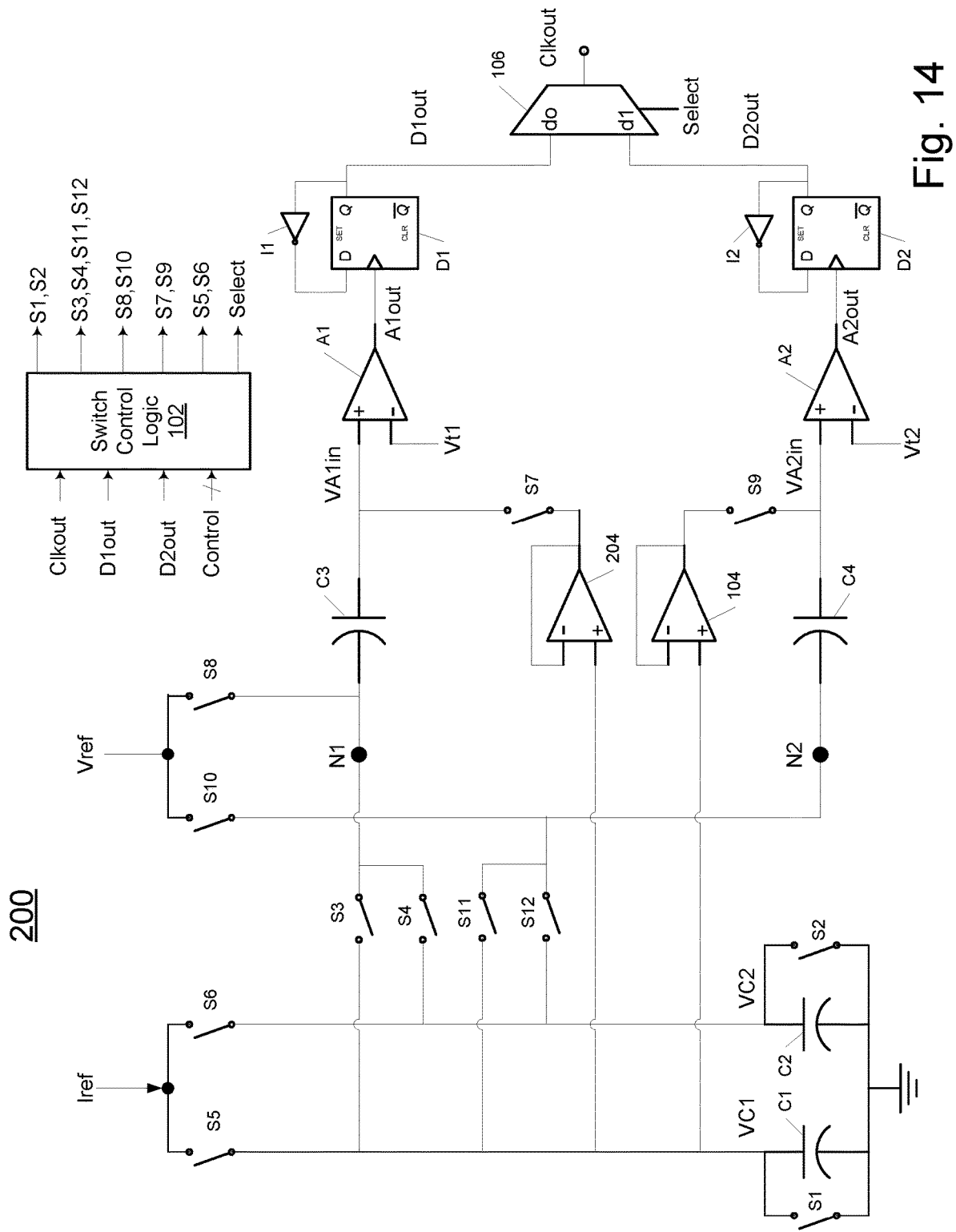
FIG. 14 illustrates a relaxation oscillation circuit according to another embodiment of the present disclosure.

One embodiment of a relaxation oscillator is shown in FIG. 1. The present disclosure contemplates alternative embodiments. FIG. 14 illustrates a relaxation oscillation circuit 200 according to another embodiment of the present disclosure. Oscillation circuit 200 is substantially similar to oscillation circuit 100 shown in FIG. 1. Several differences exists. For example, a second unity gain buffer 204 is added. The second unity gain buffer 204 facilitates a balancing of parasitic capacitances and the design of buffers and switches at a small increase in area. Oscillation circuit 200 is controlled in substantially the same manner that oscillation circuit 100 is controlled as described above.

Figure 15:
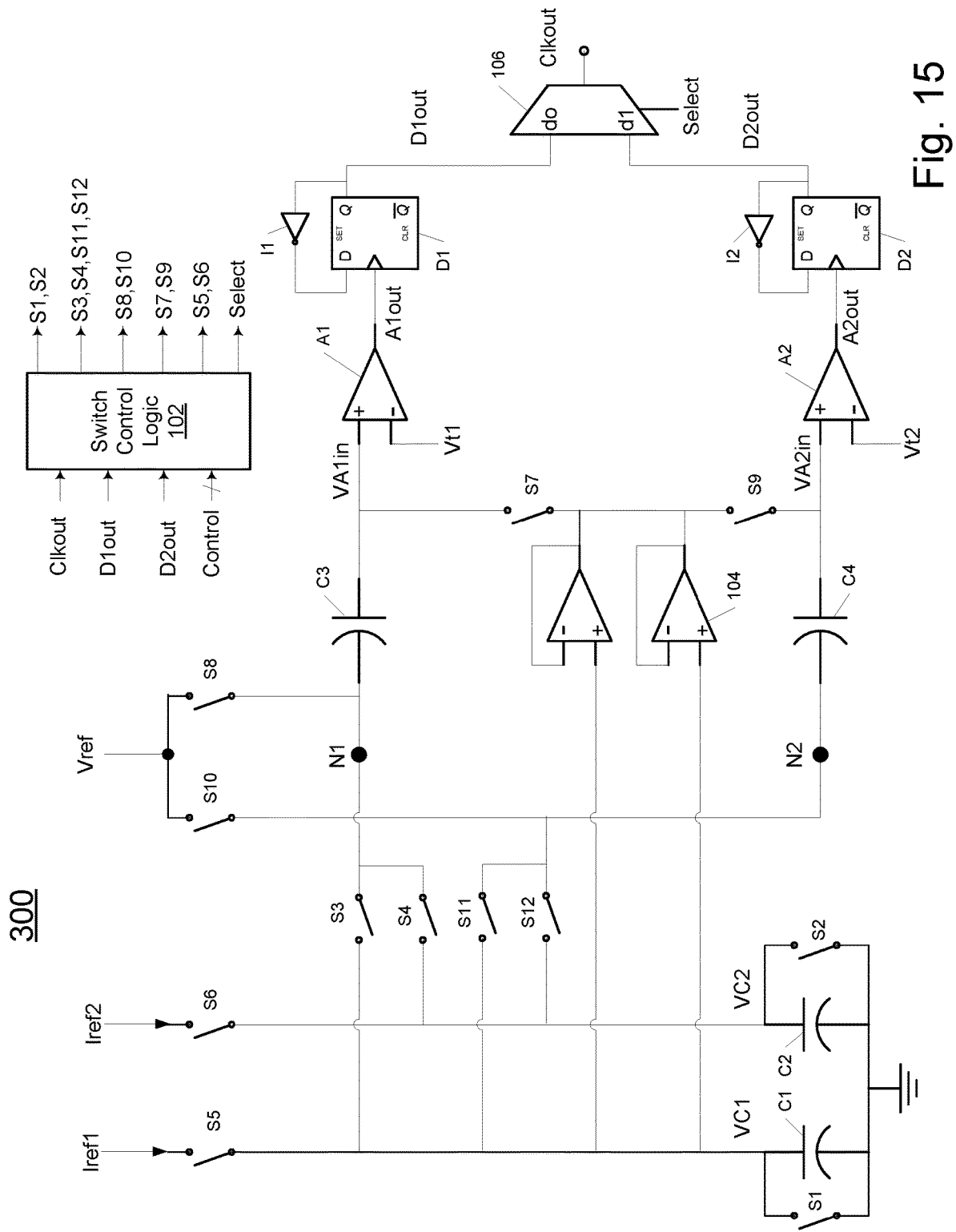
FIG. 15 illustrates a relaxation oscillation circuit according to another embodiment of the present disclosure.

FIG. 15 illustrates yet another relaxation oscillation circuit 300 according to another embodiment of the present disclosure. Oscillation circuit 300 is substantially similar to that shown in FIG. 14. Instead of one current source that provides reference current Tref, a second current source (not shown) provides a separate reference current Iref2. Oscillation circuit 300 is operated in substantially the same manner as oscillation circuit 100 described above. However, instead of capacitors C1 and C2 being alternatively charged by Tref, capacitors C1 and C2 are charged by Iref1 and Iref2, respectively. This approach may be advantageous depending upon reference current generation circuitry in addition to simplifying switch control.

Figure 16:
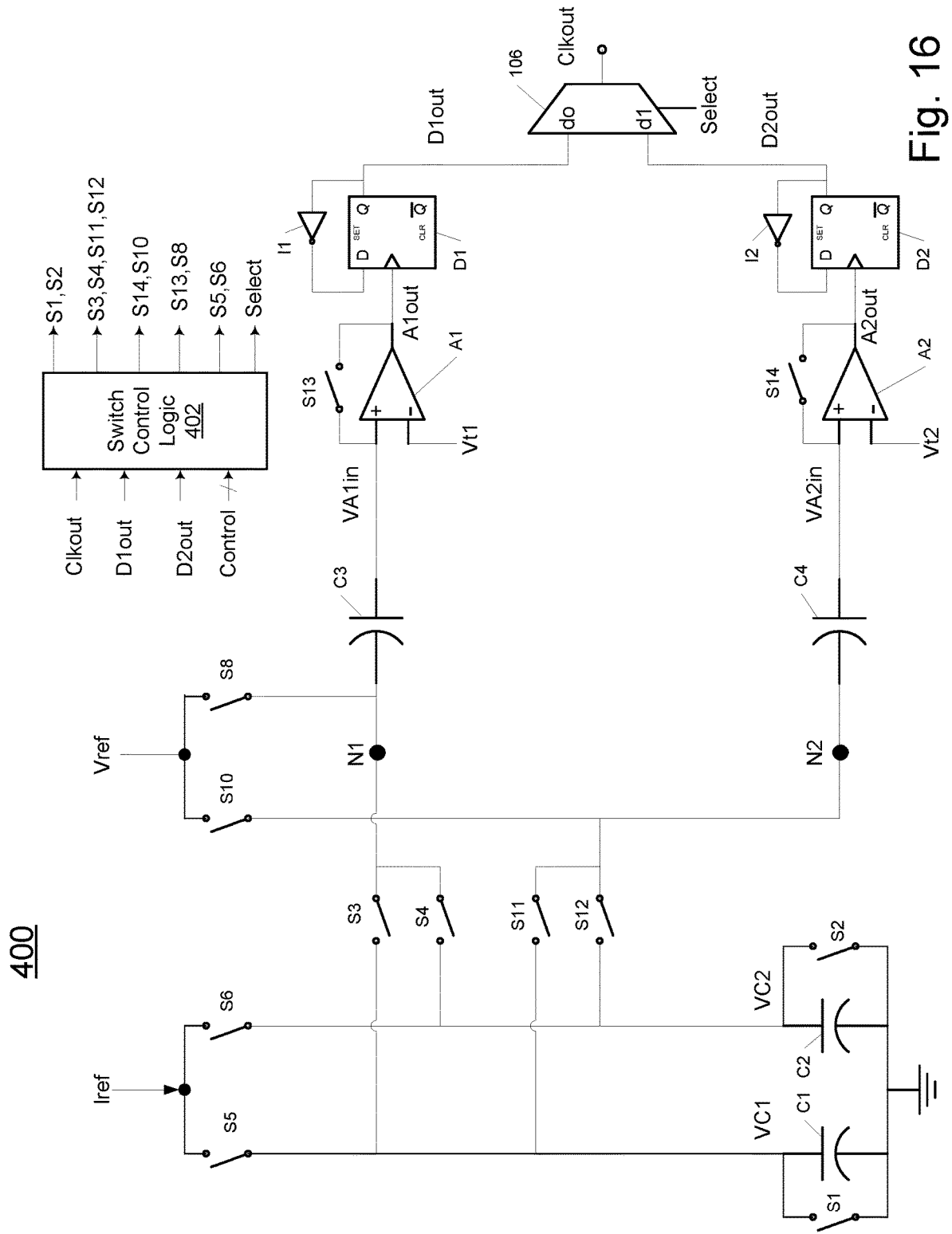
FIG. 16 illustrates a relaxation oscillation circuit according to still another embodiment of the present disclosure.

FIG. 16 illustrates yet another embodiment of a relaxation oscillation circuit 400. This oscillation circuit is similar to relaxation oscillation circuit 100, but several differences exist. Switch control logic circuit 102 is replaced by switch control logic circuit 402. Oscillation circuit 400 lacks unity gain buffers, and switches S7 and S9. The lack of unity gain buffers simplifies switch control logic 402 compared to switch control logic 102. Oscillation circuit 400 includes switches S13 and S14 that are connected between the inputs and outputs of comparators A1 and A2 as shown. Switch control logic 402 controls switches S13 and S14.

Figure 17:
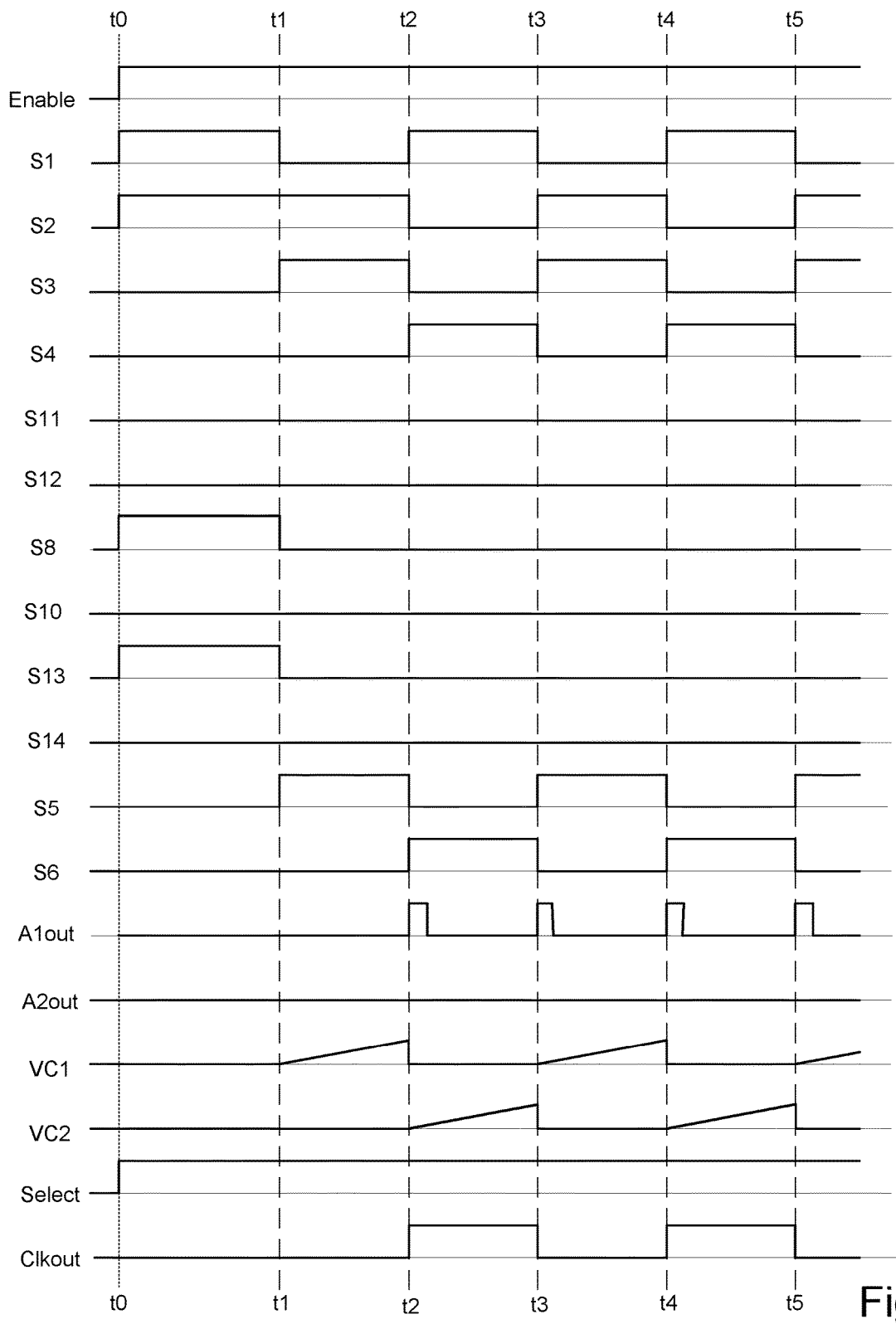
FIG. 17 is a timing diagram that illustrates relevant aspects of an example process for calibrating and running the relaxation oscillator of FIG. 16.
Figure 18:
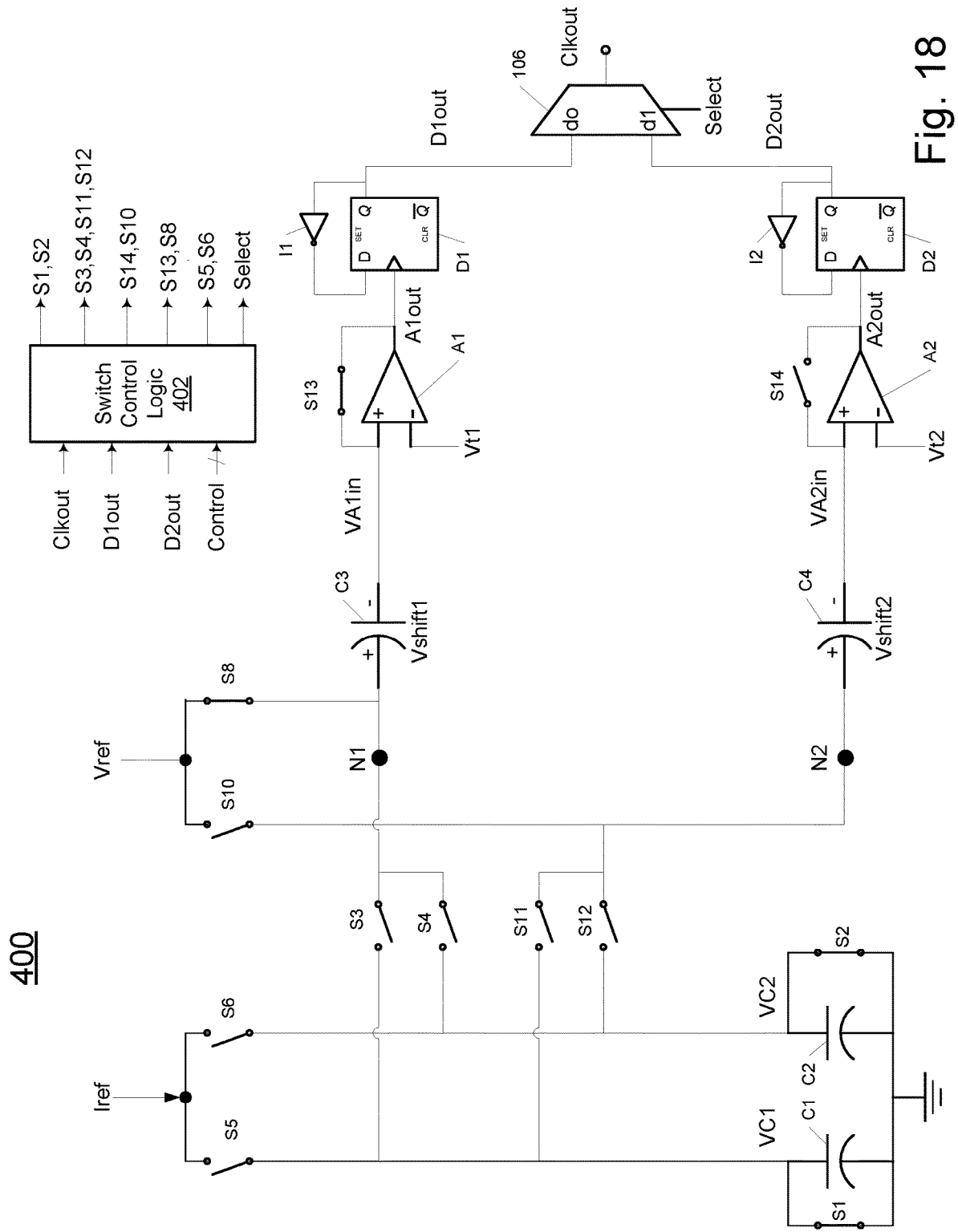
FIG. 18 shows the relaxation oscillator of FIG. 16 in a first state during calibration.

Operation is similar to that previously described, except that calibration is based on shorting a comparator's output to its input (forming a feedback loop) to force the input to a DC threshold value. FIG. 17 is a timing diagram that illustrates relevant aspects of an example process for calibrating and running relaxation oscillator 400. The calibration process begins at time t0 when the Enable signal is asserted. In response switch control logic 402 closes switches S1, S2, S8 and S13 (see FIG. 18). Closed switches S1 and S2 discharge capacitors C1 and C2. Closed switch S8 couples capacitor C3 to Vref, and closed switch S13 shorts the input and output of comparator A1. C3 is charged to a voltage Vshift1 that accounts for A1's DC offset, and not for the device's propagation delay.

Figure 19:
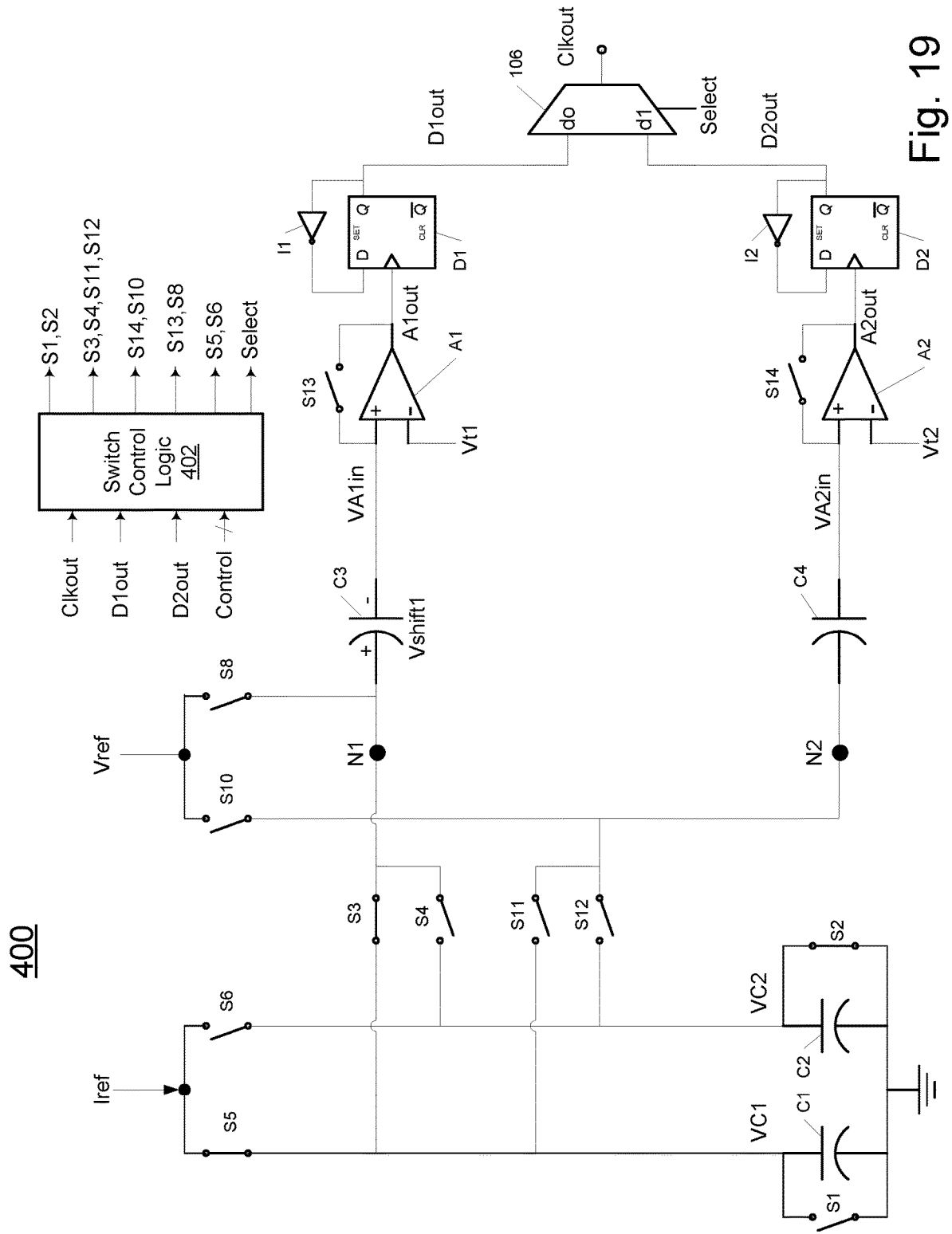
FIG. 19 shows the relaxation oscillator of FIG. 16 in a first state during run mode after calibration.
Figure 20:
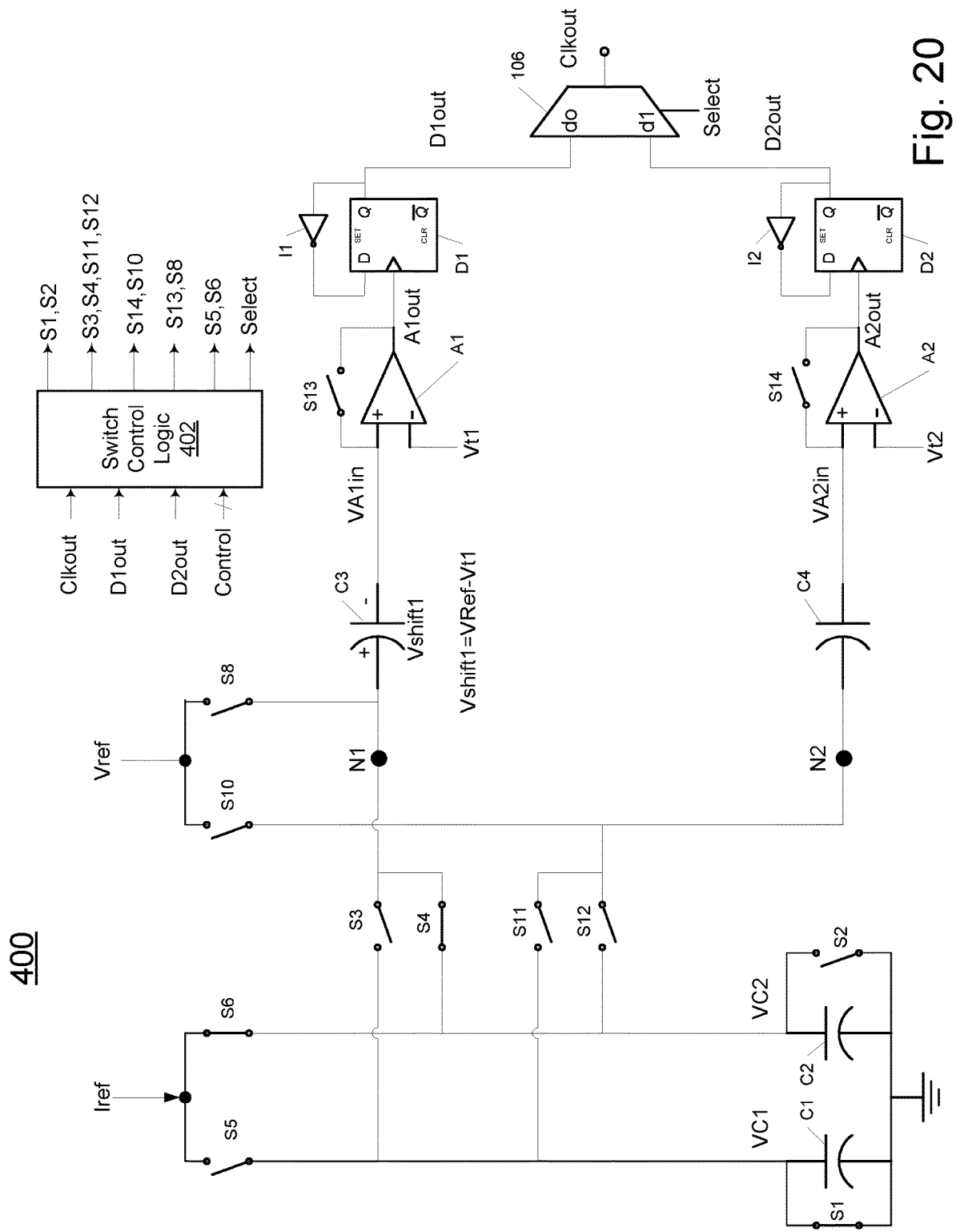
FIG. 20 shows the relaxation oscillator of FIG. 16 in a second state during run mode after calibration.
Figure 21:
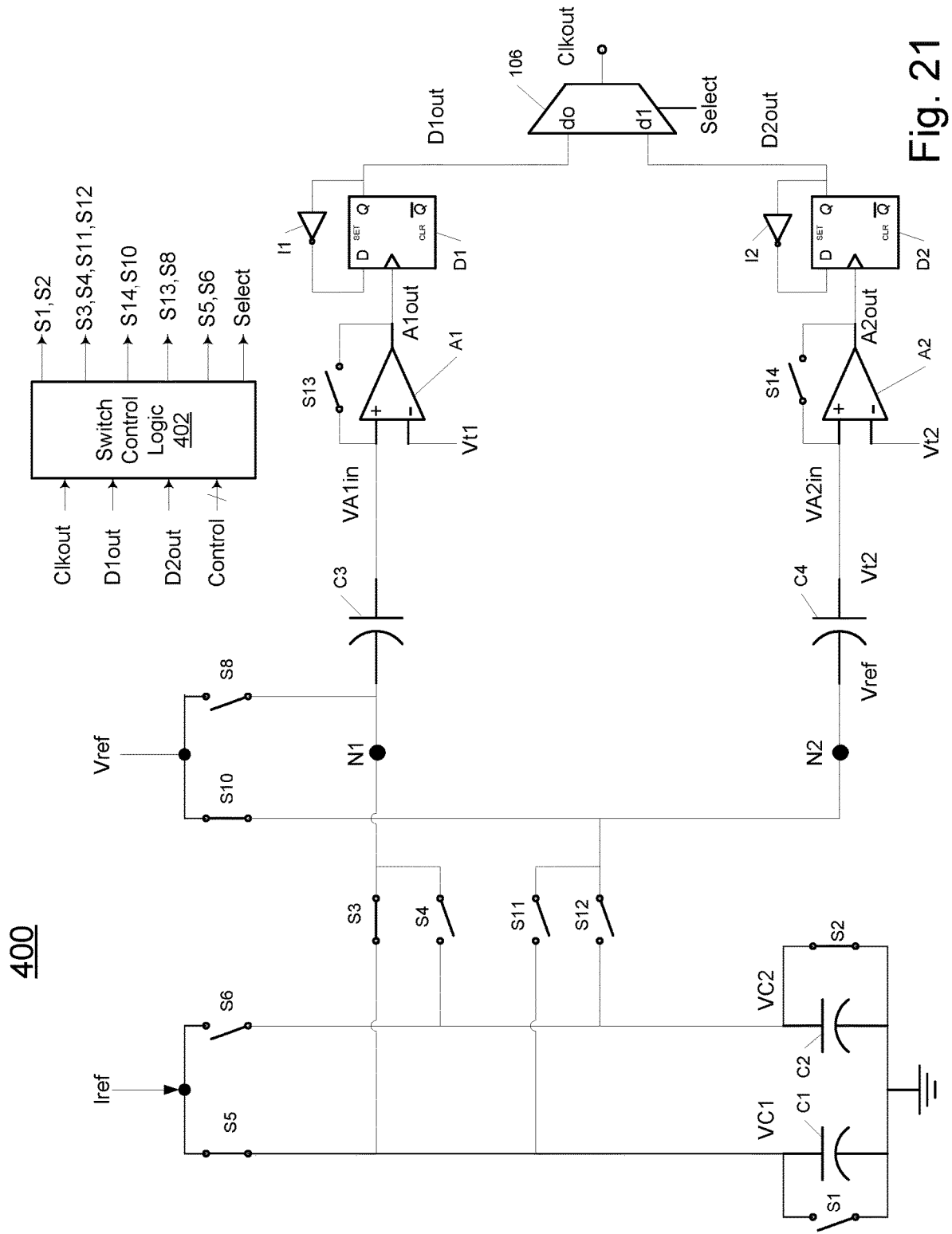
FIG. 21 shows the relaxation oscillator of FIG. 16 in a third state during run mode after calibration.

At time t1, oscillator 400 is placed in run mode. Switch control logic 402 opens switches S1 and S13 and closes switches S3 and S5 (see FIG. 19). VC1 across capacitor C1 increases as it is charged by Tref. FIG. 17 shows VC1 increasing in magnitude as it is charged by Tref. VA1in increases with VC1. At some point in time VA1in exceeds comparator A1's threshold, and A1 asserts its output A1out, which is coupled to the clock input of D1. D1out toggles to high, which causes Clkout to toggle to high. At time t2 switch control logic 402 closes switches S1 and S6, and open switches S1 and S2 (See FIG. 20). VC2 begins to rise as C2 is charged by Tref as shown in FIG. 17. As VC2 increases so does VA1in. When VA1in exceeds A1's threshold, the output of comparator A1 is asserted, which in turn toggles D1out1 from high to low. Clkout also toggles from high to low as shown in FIG. 17. In response to D1out or Clkout toggling, switch control logic 402 closes S2, S3 and S5, and opens S1, S4, and S6 (see FIG. 21). VC1 across capacitor C1 increases as it is charged by Tref. FIG. 17 shows VC1 increasing in magnitude as it is charged by Tref. VA1in increases with VC1. At some point in time VA1in exceeds comparator A1's threshold, and A1 assert its output A1out, which is coupled to the clock input of D1. D1out toggles to high, which prompts switch control logic 402 to close switches S1 and S6, and open switches S1 and S2. The process continues and Clkout oscillates accordingly.

Like oscillator 100 the performance of oscillator 400 may be affected by changes in temperature, leakage current, etc. Oscillator 400 can be periodically recalibrated to accommodate such changes. Switch control logic 402 may track the number of Clkout transitions from low to high. After X transitions (e.g., X=300), switch control logic 402 may start a recalibration process. The process begins when switch control logic 402 closes switches S10 and S14.

Figure 22:
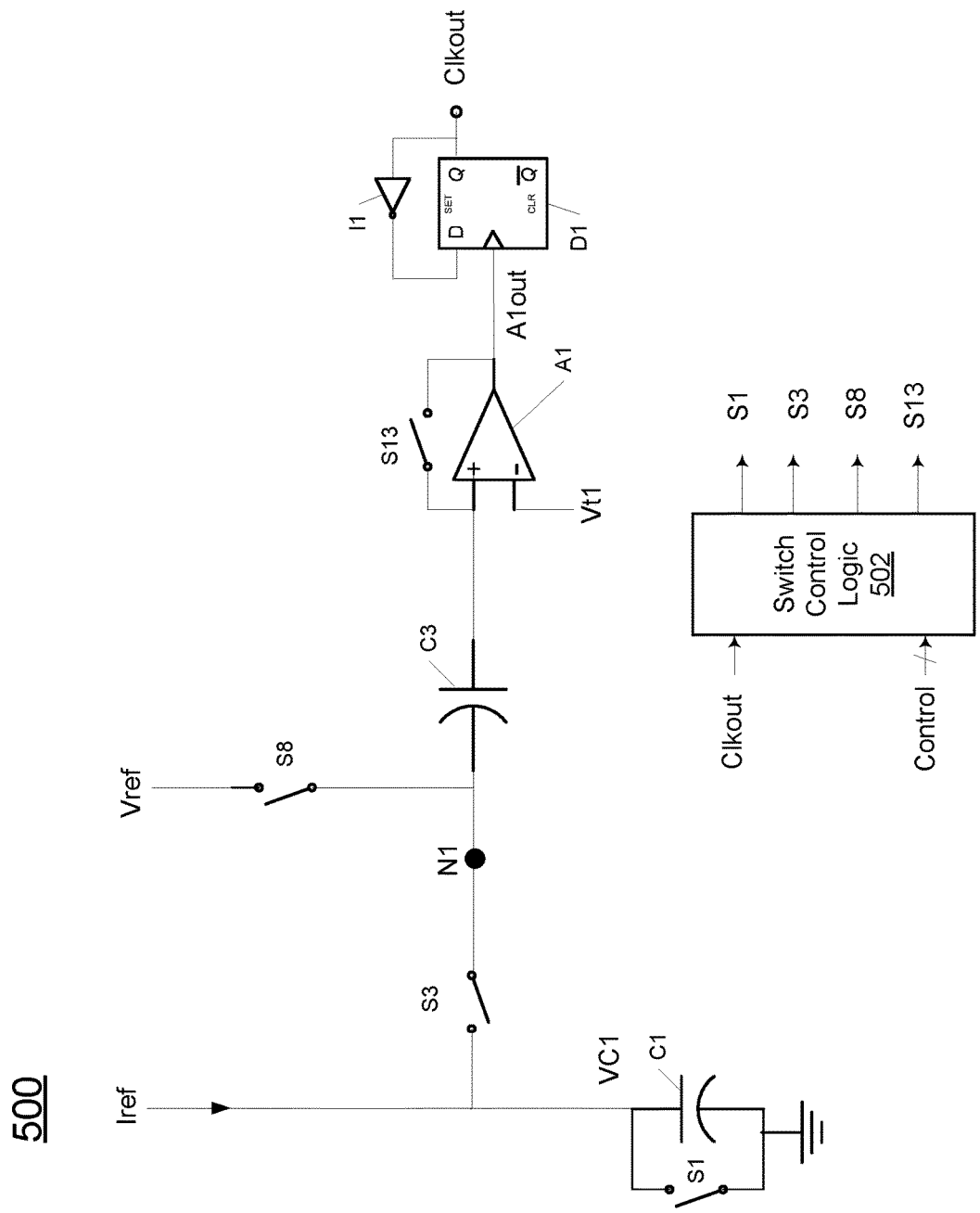
FIG. 22 illustrates a relaxation oscillation circuit according to still yet another embodiment of the present disclosure.
Figure 23:
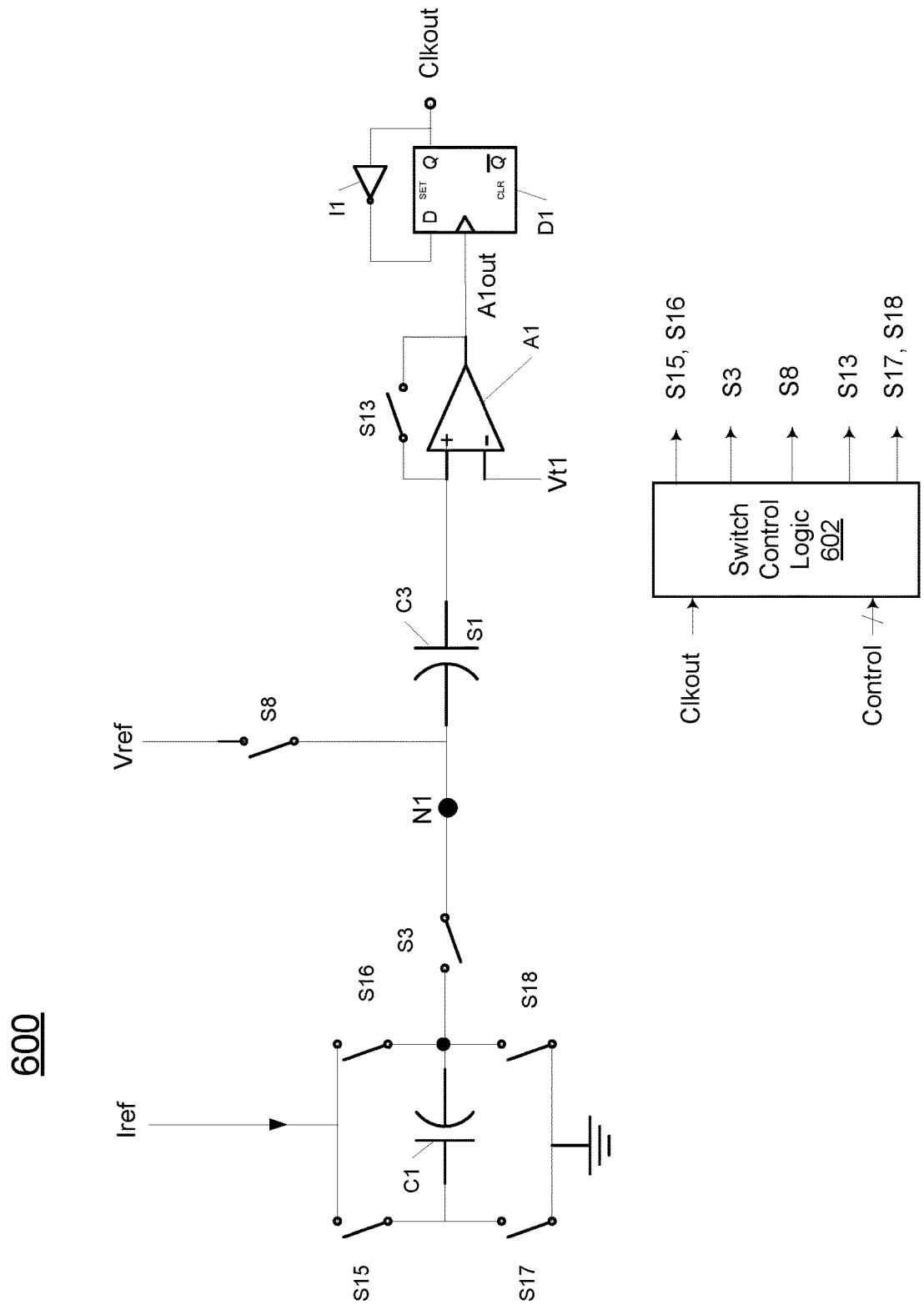
FIG. 23 illustrates a relaxation oscillation circuit according to one embodiment of the present disclosure.

FIG. 22 and FIG. 23 illustrate additional relaxation oscillation circuit 500 and relaxation oscillation circuit 600, respectively. These oscillation circuits are simplified versions of relaxation oscillation circuit 400. Relaxation oscillation circuits 500 and 600 employ a single capacitor C1, which is cyclically charged and discharged during run mode. A single path consisting of comparator A1 and a single D flip-flop D1 is used for generating oscillation signal Clkout. Oscillators 500 and 600 operate similar to oscillator 400. Calibration should be performed and completed early in the ramp time so that A1 is always put back into functional mode when VC1 exceeds A1's threshold. In 600, C1 discharge time is summed to each cycle as an offset error that creates some accuracy loss. To present this accuracy loss, capacitor C1 may be connected in a bridge configuration between switches S15-S18 as shown. C1 is flipped instead of discharged at the end of each cycle.

Although the present disclosure has been described in connection with several embodiments, the disclosure is not intended to be limited to the specific forms set forth herein. On the contrary, it is intended to cover such alternatives, modifications, and equivalents as can be reasonably included within the scope of the disclosure as defined by the appended claims.

What is claimed is:

1. An apparatus comprising:
   an oscillator for generating an oscillating signal, the oscillator comprising:
      a first comparator for comparing voltages at first and second inputs, respectively;
      a first capacitor coupled to the first input of the first comparator;
      a first circuit configured for charging the first capacitor to a first voltage, wherein the first voltage is related to a propagation delay of the first comparator and varies with the propagation delay of the first comparator;
      a second capacitor;
      a third capacitor;
      a current source for charging the second capacitor or the third capacitor with a substantially constant current;
      a first switch for coupling the first capacitor in series with the second capacitor as the second capacitor is being charged by the current source; and
      a second switch for coupling the first capacitor in series with the third capacitor as the third capacitor is being charged by the current source.

2. The apparatus of claim 1 wherein the first circuit comprises:
   a voltage source for generating a substantially constant voltage;
   a third switch for selectively coupling the voltage source to the first capacitor;
   a first unity gain buffer comprising an input coupled to the second capacitor;
   a fourth switch for selectively coupling the first input of the first comparator to an output of the first unity gain buffer.

3. The apparatus of claim 2 further comprising:
   a switch control circuit configured to control the first switch, the second switch, the third switch, and the fourth switch;
   wherein the first voltage is further related to a propagation delay of the switch control circuit.

4. The apparatus of claim 3 wherein the oscillator further comprises:
   a second comparator for comparing voltages at first and second inputs, respectively;
   a fourth capacitor coupled to the first input of the second comparator;
   a second circuit configured for charging the fourth capacitor with a second voltage;
   wherein the second voltage is related to a propagation delay of the second comparator.

5. The apparatus of claim 4 wherein the oscillator further comprises:
   a second flip-flop comprising a clock input coupled to an output of the second comparator, a data input, and a data output;
   wherein the second voltage is further related to a propagation delay of the second flip-flop.

6. The apparatus of claim 5 wherein a multiplexer comprising a second input coupled to the data output of the second flip-flop;
   wherein the second voltage is further related to a second propagation delay between the second input and an output of the multiplexer.

7. The apparatus of claim 4 wherein the oscillator further comprises:
   a fifth switch for coupling the fourth capacitor in series with the second capacitor as the second capacitor is being charged by the current source;
   a sixth switch for coupling the fourth capacitor in series with the third capacitor as the third capacitor is being charged by the current source.

8. The apparatus of claim 7 wherein the second circuit comprises:
   a seventh switch for selectively coupling the voltage source to the fourth capacitor;
   an eighth switch for selectively coupling the first input of the second comparator to the output of the first unity gain buffer.

9. The apparatus of claim 7 wherein the second circuit comprises:
   a seventh switch for selectively coupling the voltage source to the fourth capacitor;
   a second unity gain buffer with an input coupled to the second capacitor;
   an eighth switch for selectively coupling the first input of the second comparator to the output of the second unity gain buffer.

10. The apparatus of claim 8 further comprising:
    a ninth switch for selectively coupling the current source to the second capacitor;
    a tenth switch for selectively coupling the current source to the third capacitor;
    an eleventh switch for selectively discharging the second capacitor;
    a twelfth switch for selectively discharging the third capacitor;
    wherein the switch control logic is configured to control the first-twelfth switches.

11. An apparatus comprising:
    an oscillator for generating an oscillating signal, the oscillator comprising:
       a first comparator for comparing voltages at first and second inputs, respectively;
       a first capacitor coupled to the first input of the first comparator;
       a first circuit configured for charging the first capacitor to a first voltage, wherein the first voltage is related to a propagation delay of the first comparator and varies with the propagation delay of the first comparator;
       a first flip-flop comprising a clock input coupled to an output of the first comparator, a data input, and a data output, wherein the first voltage is further related to a propagation delay of the first flip-flop; and
       a multiplexer comprising a first input coupled to the data output of the first flip-flop, wherein the first voltage is further related to a first propagation delay between the first input and an output of the multiplexer.

12. An apparatus comprising:
    an oscillator for generating an oscillating signal, the oscillator comprising:

a first comparator for comparing voltages at first and second inputs, respectively;

a first capacitor coupled to the first input of the first comparator;

a second capacitor;

a third capacitor;

a current source for charging the second capacitor or the third capacitor with a substantially constant current;

a first switch for coupling the first capacitor in series with the second capacitor as the second capacitor is being charged by the current source;

a second switch for coupling the first capacitor in series with the third capacitor as the third capacitor is being charged by the current source; and a first circuit for periodically charging the first capacitor.

13. The apparatus of claim 12 wherein the first circuit charges the first capacitor to a first voltage that is related to a propagation delay of the first comparator.

14. The apparatus of claim 13 wherein the oscillator further comprises:

a first flip-flop comprising a clock input coupled to an output of the first comparator, a data input, and a data output;

wherein the first voltage is further related to a propagation delay of the first flip-flop.

15. The apparatus of claim 14 wherein the oscillator further comprises:

a multiplexer comprising a first input coupled to the data output of the first flip-flop;

wherein the first voltage is further related to a first propagation delay between the first input and an output of the multiplexer.

16. An apparatus comprising:

an oscillator for generating an oscillating signal, the oscillator comprising:

a first capacitor;

a current source that provides a substantially constant current;

a first switch for selectively connecting the first capacitor with the current source;

a second switch for selectively discharging the first capacitor;

a control circuit for controlling the first and second switches based on the oscillating signal;

a circuit for adjusting the oscillating signal based on changes in temperature of the oscillator;

a first comparator for comparing voltages at first and second inputs, respectively;

a second capacitor coupled to the first input of the first comparator;

a third switch for selectively coupling the first capacitor in series with the second capacitor; and a first circuit for periodically charging the second capacitor.

* * * * *